US012620970B2

(12) United States Patent
Kim et al.

(10) Patent No.: US 12,620,970 B2
(45) Date of Patent: May 5, 2026

(54) INTEGRATED DEVICES WITH MULTIPLE ACOUSTIC RESONATOR CHIPLETS

(71) Applicant: QUALCOMM Incorporated, San Diego, CA (US)

(72) Inventors: Jonghae Kim, San Diego, CA (US); Je-Hsiung Lan, San Diego, CA (US); Ranadeep Dutta, Del Mar, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 226 days.

(21) Appl. No.: 18/422,505

(22) Filed: Jan. 25, 2024

(65) Prior Publication Data

US 2025/0247076 A1     Jul. 31, 2025

(51) Int. Cl.
| | |
|---|---|
| *H03H 9/205* | (2006.01) |
| *H03H 3/02* | (2006.01) |
| *H03H 9/56* | (2006.01) |

(52) U.S. Cl.
CPC .............. *H03H 9/205* (2013.01); *H03H 3/02* (2013.01); *H03H 9/568* (2013.01)

(58) Field of Classification Search
CPC ......... H03H 9/205; H03H 3/02; H03H 9/568; H03H 9/02157; H03H 9/0542; H03H 9/0547; H03H 9/0552; H03H 9/0557; H03H 9/0561; H03H 9/1042; H03H 9/542; H03H 9/582; H03H 9/605; H03H 9/0523; H03H 2003/0471
See application file for complete search history.

(56) References Cited

U.S. PATENT DOCUMENTS

| | | | | |
|---|---|---|---|---|
| 7,019,605 | B2 * | 3/2006 | Larson, III ............. | H03H 9/587 |
| | | | | 310/326 |
| 7,612,636 | B2 * | 11/2009 | Jamneala ............. | H03H 9/0095 |
| | | | | 333/191 |
| 10,778,185 | B2 * | 9/2020 | Matsumoto .............. | H03H 9/13 |
| 11,206,008 | B2 * | 12/2021 | Dogiamis ................ | H03H 9/10 |
| 2007/0115079 | A1 * | 5/2007 | Kubo ..................... | H03H 9/564 |
| | | | | 333/189 |
| 2012/0104900 | A1 * | 5/2012 | Nishihara .............. | H03H 9/587 |
| | | | | 310/326 |
| 2019/0372555 | A1 | 12/2019 | Shealy et al. | |
| 2022/0069797 | A1 * | 3/2022 | Kim ..................... | H03H 9/1064 |
| 2022/0109427 | A1 | 4/2022 | Guyette et al. | |
| 2023/0170876 | A1 | 6/2023 | Burak et al. | |

FOREIGN PATENT DOCUMENTS

DE          69838195 T2     5/2008

OTHER PUBLICATIONS

International Search Report and Written Opinion—PCT/US2025/010785—ISA/EPO—Jul. 4, 2025.
Partial International Search Report—PCT/US2025/010785—ISA/EPO—May 12, 2025.

* cited by examiner

*Primary Examiner* — John W Poos
(74) *Attorney, Agent, or Firm* — Moore IP

(57)          ABSTRACT
A device includes a resonator stack. The resonator stack includes a first chiplet including a first acoustic resonator having a first resonant frequency and a second chiplet including a second acoustic resonator having a second resonant frequency that is different from the first resonant frequency. The device also includes a substrate coupled to the resonator stack, and electrical interconnections between the first chiplet and the second chiplet to provide a conductive path between the first acoustic resonator and the second acoustic resonator.

26 Claims, 11 Drawing Sheets

Incoming Wafers 610

Wafer 1
(e.g., Premium node CMOS)

602A

Wafer N
(e.g., Nonpremium node CMOS)

602N

Wafer Processing 630

602A

Back-grind for
wafer thinning t1 t2 < t1

634A

632A

Dicing

636A t2

Dies from first
wafer

640A

602N

Back-grind for
wafer thinning t3 t4 < t3

634N

632N

Dicing

636N t4

Dies from Nth
wafer

640N

640A

640B

640N

Reconstitution and Molding Process 650

Die 1

640A

640A

640B

640N

Die 2

Die N

640B

640N

640A

640B

640N

670

660

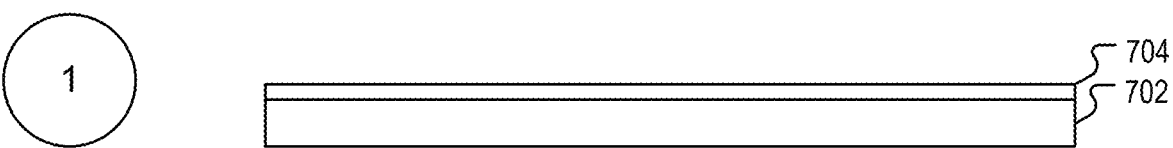
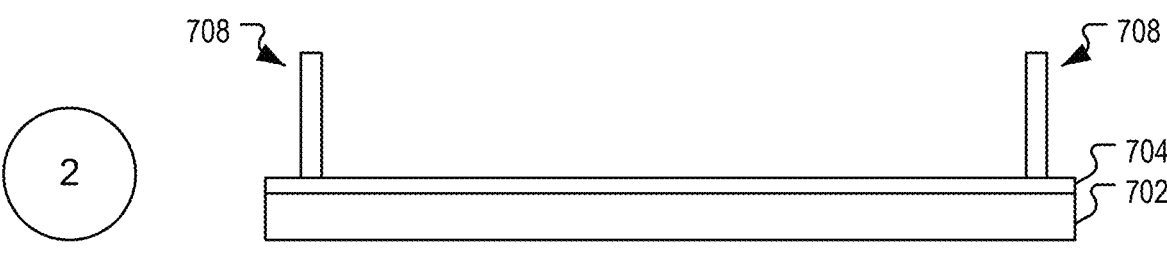
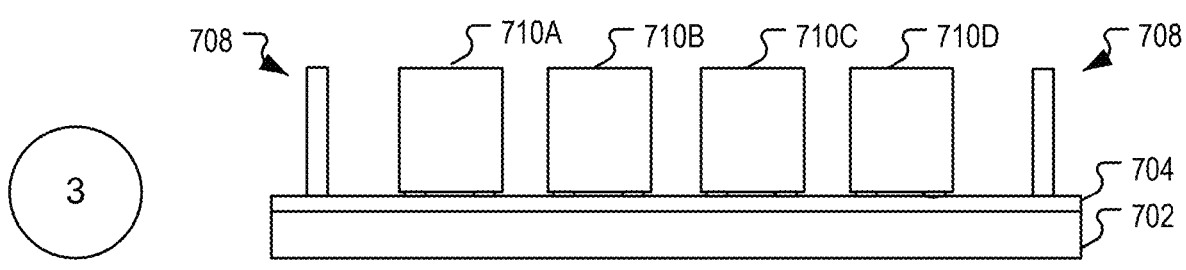
FIG. 7A

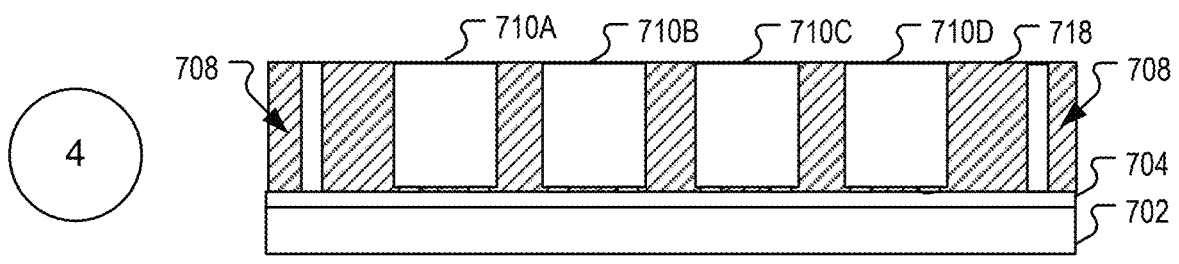
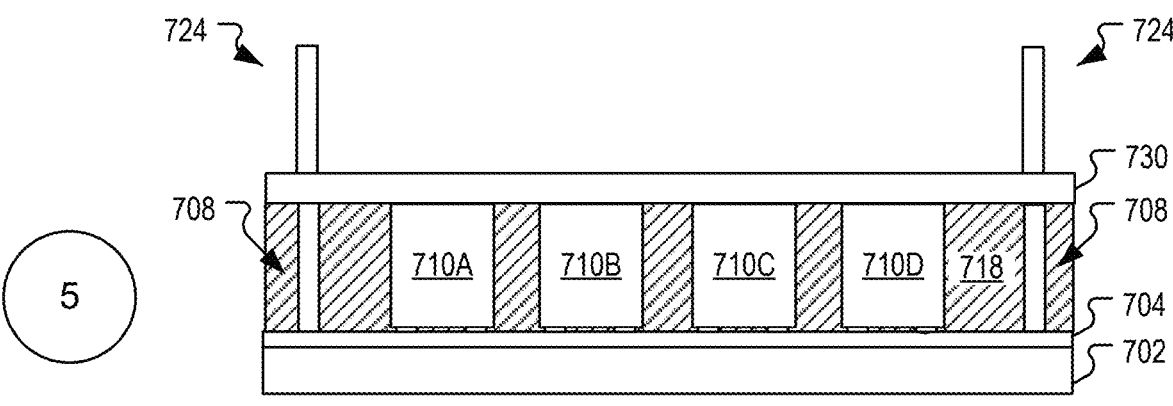
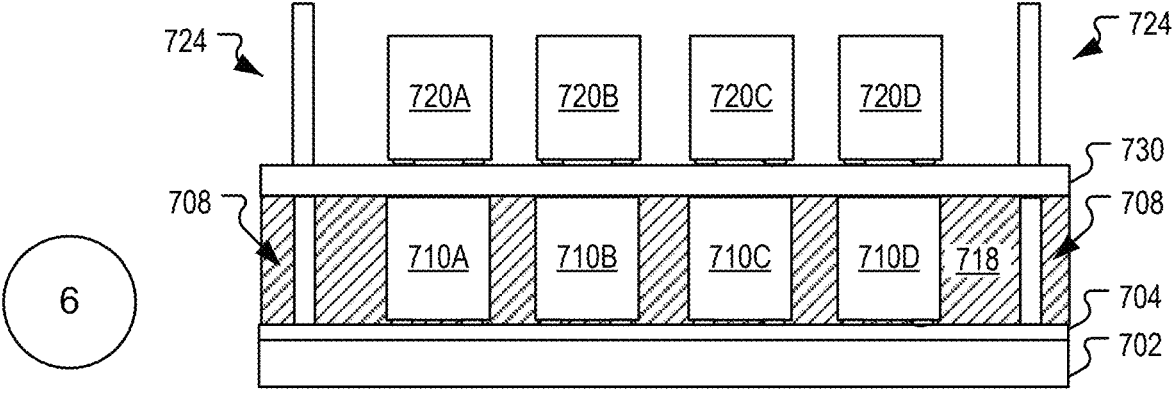
*FIG. 7B*

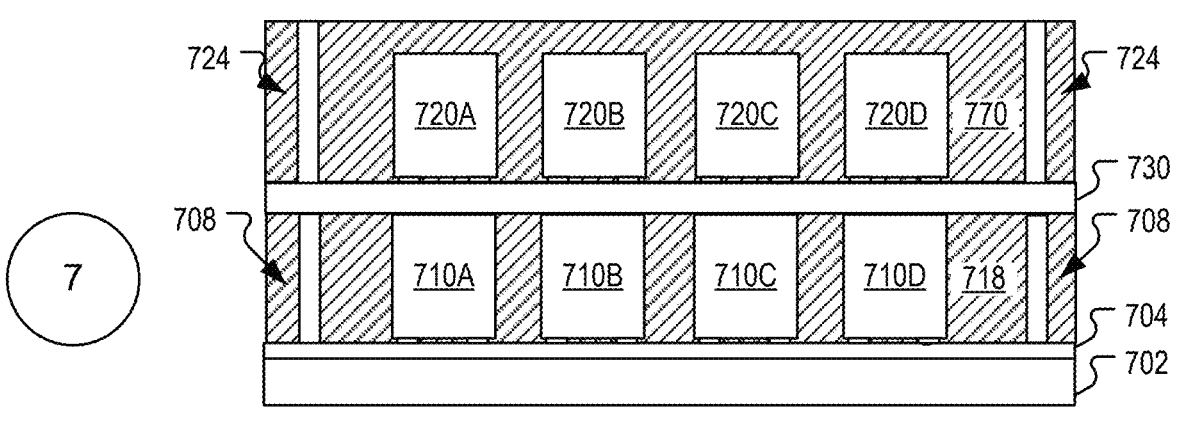
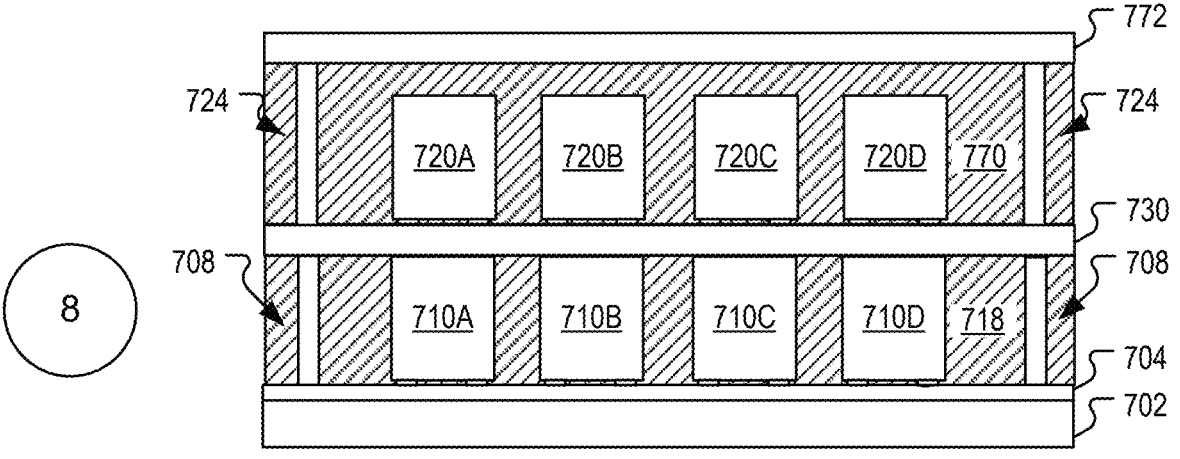
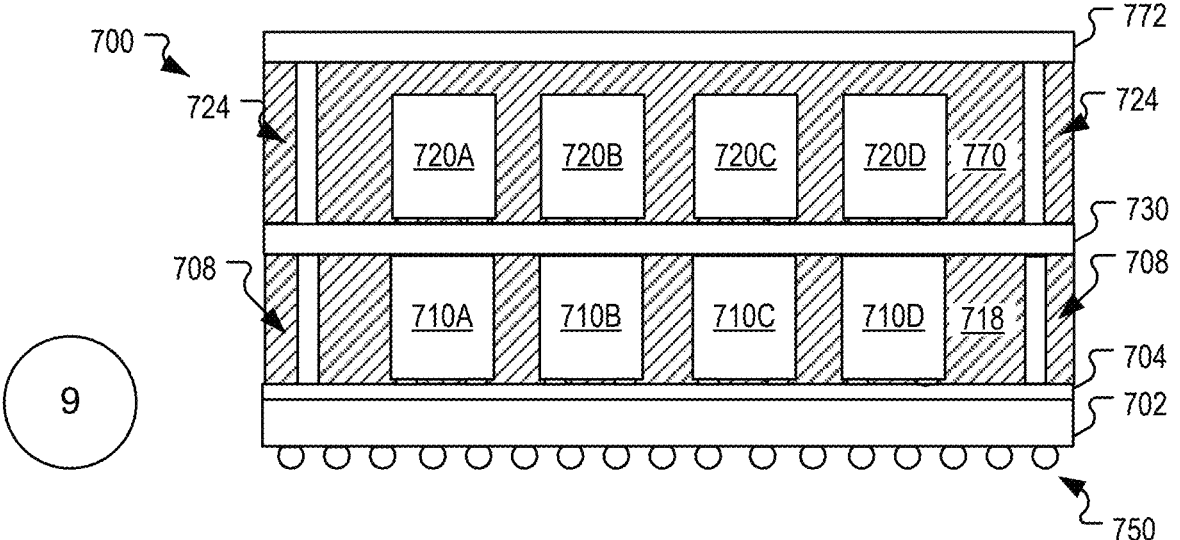
*FIG. 7C*

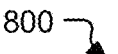

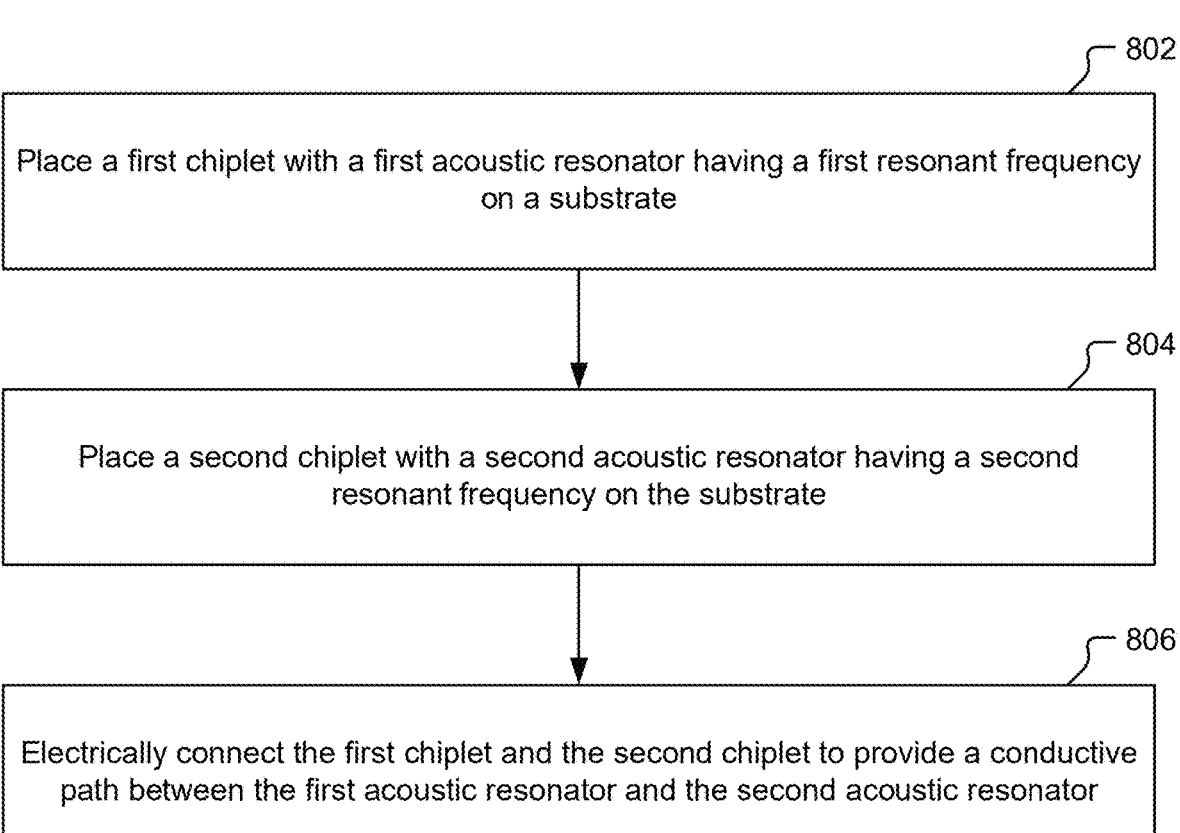

800

802

Place a first chiplet with a first acoustic resonator having a first resonant frequency on a substrate

804

Place a second chiplet with a second acoustic resonator having a second resonant frequency on the substrate

806

Electrically connect the first chiplet and the second chiplet to provide a conductive path between the first acoustic resonator and the second acoustic resonator

FIG. 8

INTEGRATED DEVICES WITH MULTIPLE ACOUSTIC RESONATOR CHIPLETS

FIELD

Various features relate to acoustic resonators in integrated devices.

BACKGROUND

Cell phones and other radio frequency (RF) devices often utilize acoustic resonators, such as a bulk acoustic wave resonator (BAR), for filtering RF signals. A conventional acoustic resonator includes a thin film of a piezoelectric material, such as aluminum nitride (AlN), in an acoustic layer that is sandwiched between metal electrodes, and the acoustic resonator may be isolated from a substrate via an air gap. An applied RF signal drives the electrodes and generates resonant excitation in the piezoelectric layer at a resonant frequency for the acoustic resonator. The resonant frequency depends upon the thickness of the acoustic layer.

Because the resonant frequency depends upon the thickness of the acoustic layer, designing an RF filter to operate across a wide range of frequencies requires multiple acoustic resonators having different thickness to provide the desired resonant frequencies. However, wafer process constraints limit an amount of variation of the thickness of the acoustic layer, in addition to preventing the integration of multiple different types of acoustic resonators on a wafer. The acoustic resonators on the wafer are therefore constrained to a narrow range of resonant frequencies and, as a result, RF filtering using the acoustic resonators is constrained to a relatively narrow range of frequencies.

SUMMARY

Various features relate to acoustic resonators in integrated devices.

One example provides a device that includes a resonator stack. The resonator stack includes a first chiplet including a first acoustic resonator having a first resonant frequency and a second chiplet including a second acoustic resonator having a second resonant frequency that is different from the first resonant frequency. The device includes a substrate coupled to the resonator stack. The device also includes electrical interconnections between the first chiplet and the second chiplet to provide a conductive path between the first acoustic resonator and the second acoustic resonator.

Another example provides a device that includes a resonator stack. The resonator stack includes a first stack layer and a second stack layer. The first stack layer includes a first chiplet including a first acoustic resonator having a first resonant frequency, and a second chiplet including a second acoustic resonator having a second resonant frequency that is different from the first resonant frequency. The second stack layer includes a third chiplet including a third acoustic resonator having a third resonant frequency, and a fourth chiplet including a fourth acoustic resonator having a fourth resonant frequency that is different from the third resonant frequency. The resonator stack also includes mold compound at least partially encapsulating the first chiplet, the second chiplet, the third chiplet, the fourth chiplet, and a set of through-mold conductors. The device also includes first electrical interconnections between the first chiplet and the second chiplet to provide a first conductive path between the first acoustic resonator and the second acoustic resonator. The device further includes second electrical interconnections between the third chiplet and the fourth chiplet to provide a second conductive path between the third acoustic resonator and the fourth acoustic resonator.

Another example provides a method for fabricating an integrated device. The method includes placing a first chiplet with a first acoustic resonator having a first resonant frequency on a substrate, and placing a second chiplet with a second acoustic resonator having a second resonant frequency on the substrate. The method also includes electrically connecting the first chiplet and the second chiplet to provide a conductive path between the first acoustic resonator and the second acoustic resonator.

BRIEF DESCRIPTION OF THE DRAWINGS

Various features, nature and advantages may become apparent from the detailed description set forth below when taken in conjunction with the drawings in which like reference characters identify correspondingly throughout.

FIG. 4 illustrates a schematic cross-sectional view of another example of the exemplary integrated device of FIG. 1.

FIGS. 7A, 7B and 7C together illustrate another exemplary sequence for fabricating the exemplary integrated device of FIG. 1.

FIG. 8 illustrates an exemplary flow diagram of a method for fabricating an exemplary integrated device having multiple acoustic resonator chiplets.

DETAILED DESCRIPTION

Figure 1:
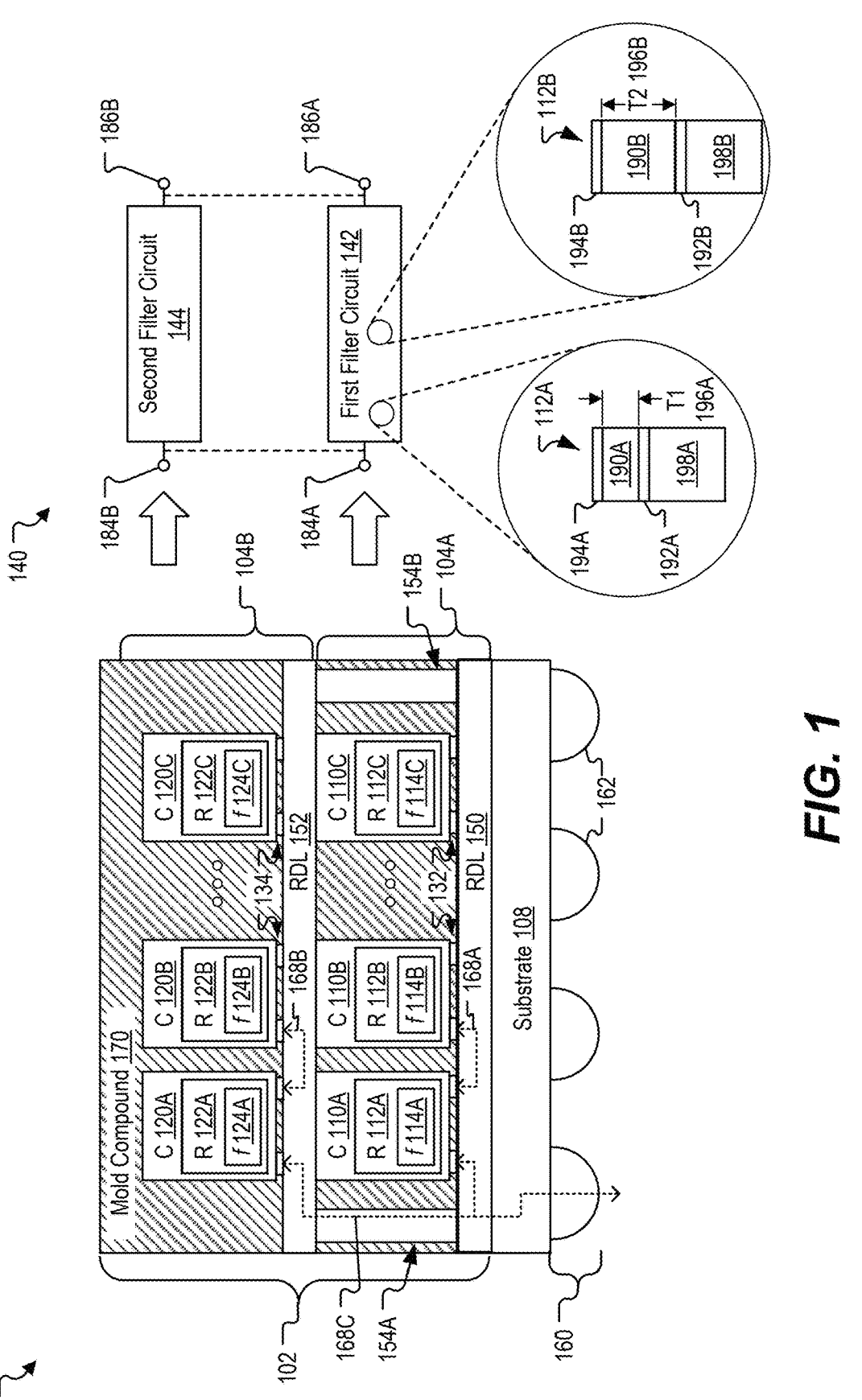
FIG. 1 illustrates a schematic cross-sectional view of an example of an exemplary integrated device having multiple acoustic resonator chiplets.

Particular aspects of the disclosure describe integrated devices and methods of fabrication that include multiple acoustic resonators that have different resonant frequencies. Conventionally, wafer process constraints limit an amount of variation of the thickness of the acoustic layer, in addition to preventing the integration of multiple different types of acoustic resonators on a wafer, constraining the resulting acoustic resonators to a narrow range of resonant frequencies.

The disclosed integrated devices overcome such constraints by including multiple acoustic resonators that may be formed from different wafers and that therefore may have a variety of thicknesses and/or a variety of resonator types. As a result, the acoustic resonators in the disclosed integrated devices can have a much wider range of resonant frequencies, enabling a wider range of filtering (e.g., broadband RF filtering).

According to an aspect, the disclosed integrated devices include a resonator stack having multiple stack layers, and each stack layer includes multiple chiplets that include acoustic resonators. The chiplets may be formed from different wafers, enabling each of the multiple stack layers to include multiple different types of acoustic resonators and/or acoustic resonators with multiple different acoustic layer thicknesses that can be interconnected within each stack layer, such as to form an RF filtering circuit. Each such chiplet may include multiple acoustic resonators, which may also be "tuned" to have variation in the thickness of the respective acoustic layers in accordance with the above-described constraints imposed by conventional single-wafer processing.

According to an aspect, each of the stack layers may correspond to a reconstituted die and may include a set of redistribution layers that provide electrical connections between the chiplets of the stack layer and a mold compound that encapsulates the components of the stack layer. The stack layers may be stacked and interconnected, e.g., using microbumps or hybrid bonding, such that the redistribution layers of each of the stack layers are electrically connected to each other, e.g., using through-mold vias (TMVs), to provide signal paths between adjacent stack layers of the resonator stack. Thus, components from multiple stack layers may be interconnected, providing enhanced flexibility in forming circuits, such as RF filter circuits, from the components in the resonator stack.

According to some aspects, one or more of the stack layers includes a capacitor chiplet with an array of capacitors that can be mounted on the redistribution layers of the stack layer and electrically interconnected with other components in the resonator stack, such as acoustic resonator chiplets, via the redistribution layers and/or the TMVs. Alternatively, or in addition, one or more of the stack layers includes an inductor chiplet with an array of inductors that can be mounted on the redistribution layers of the stack layer and electrically interconnected with other components in the resonator stack via the redistribution layers and/or the TMVs. Such capacitor chiplet(s) and/or inductor chiplet(s) included in the resonator stack may provide matching capacitances and/or inductances for an RF filter circuit, thus avoiding the increased size and complexity that arises from including extra passive components in conventional acoustic unit filter products.

In various implementations, by combining acoustic resonators having multiple resonant frequencies and formed from different wafer processes into one or more layers of a resonator stack, the disclosed integrated device can implement relatively complication acoustic filters using 3D integration. In some examples, a duplexer can be formed by a first filter circuit in a first stack layer of the resonator stack that is coupled though TMVs to a second filter circuit in a second stack layer of the resonator stack. According to another example, components of the resonator stack can be coupled to a multiplexor that is further coupled to inductor-capacitor (LC)-resonator dies of a radiofrequency front-end filtering circuit.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

In some drawings, multiple instances of a particular type of feature are used. Although these features are physically and/or logically distinct, the same reference number is used for each, and the different instances are distinguished by addition of a letter to the reference number. When the features as a group or a type are referred to herein e.g., when no particular one of the features is being referenced, the reference number is used without a distinguishing letter. However, when one particular feature of multiple features of the same type is referred to herein, the reference number is used with the distinguishing letter. For example, referring to FIG. 1, multiple chiplets are illustrated and associated with reference numbers 110A, 110B, and 110C. When referring to a particular one of these chiplets, such as a chiplet 110A, the distinguishing letter "A" is used. However, when referring to any arbitrary one of these chiplets or to these chiplets as a group, the reference number 110 is used without a distinguishing letter.

Improvements in manufacturing technology and demand for lower cost and more capable electronic devices has led to increasing complexity of ICs. Often, more complex ICs have more complex interconnection schemes to enable interaction between ICs of a device. The number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

Stacked die schemes and chiplet architectures are becoming more common as significant power performance area (PPA) yield enhancements are demonstrated for stacked die and chiplet architecture product lines. As used herein, "stacked dies" and/or "stacked ICs" refer to arrangements in which one die (e.g., a first die) is disposed over (including directly over) another die (e.g., a second die).

As used herein, the term "layer" includes a film, and is not construed as indicating a vertical or horizontal thickness unless otherwise stated. As used herein, the term "stack layer" refers to the individual layers of a resonator stack, each of which may be formed as a reconstituted die. As used herein, the term "chiplet" may refer to an integrated circuit block, a functional circuit block, or other like circuit block specifically designed to work with one or more other chiplets to form a larger, more complex chiplet architecture.

Exemplary Device Including Multiple Acoustic Resonator Chiplets

FIG. 1 illustrates a schematic cross-sectional view of an example of an exemplary integrated device 100. The device 100 includes a resonator stack 102 that includes a plurality of stack layers (e.g., a first stack layer 104A and a second stack layer 104B). The resonator stack 102 is coupled to a top side of a substrate 108, and a set of external contacts 162 (such as a ball grid array 160) are disposed on a bottom side of the substrate 108.

The first stack layer 104A includes a first set of chiplets (C) 110, illustrated as a chiplet 110A, a chiplet 110B, and one or more additional chiplets including a chiplet 110C. Each of the chiplets 110 includes an acoustic resonator (R) 112 that has a corresponding resonant frequency (f) 114. To illustrate, the chiplet 110A includes an acoustic resonator 112A having a resonant frequency 114A, the chiplet 110B includes an acoustic resonator 112B having a resonant frequency 114B, and the chiplet 110C includes an acoustic resonator 112C having a resonant frequency 114C. Although a single representative acoustic resonator 112 is illustrated in each of the chiplets 110, in some examples one or more of the chiplets 110 can include multiple acoustic resonators 112. In some examples, one or more of the chiplets 110 also includes other passive or active components that can be formed in and/or over a semiconductor substrate by formation of various insulating layers, conductive layers, and doped/undoped regions. In some implementations, a front end of line (FEOL) process may be used to fabricate the acoustic resonators 112 in and/or over semiconductor substrates of the respective chiplets 110.

The second stack layer 104B is on the first stack layer 104A and includes a second set of chiplets 120, illustrated as a chiplet 120A, a chiplet 120B, and one or more additional chiplets including a chiplet 120C. Each of the chiplets 120 includes an acoustic resonator 122 that has a corresponding resonant frequency 124. To illustrate, the chiplet 120A includes an acoustic resonator 122A having a resonant frequency 124A, the chiplet 120B includes an acoustic resonator 122B having a resonant frequency 124B, and the chiplet 120C includes an acoustic resonator 122C having a resonant frequency 124C. Although a single representative acoustic resonator 122 is illustrated in each of the chiplets 120, in some examples one or more of the chiplets 120 can include multiple acoustic resonators 122. In some examples, one or more of the chiplets 120 also includes other passive or active components that can be formed in and/or over a semiconductor substrate by formation of various insulating layers, conductive layers, and doped/undoped regions. In some implementations, a front end of line (FEOL) process may be used to fabricate the acoustic resonators 122 in and/or over semiconductor substrates of the respective chiplets 120.

In a particular aspect, the resonator stack 102 includes redistribution layers to provide electrical interconnections between a first acoustic resonator of a first chiplet and a second acoustic resonator of a second chiplet that are included in a single stack layer 104. For example, the resonator stack 102 includes a first redistribution layer (RDL) 150 coupled to components in the first stack layer 104A and a second RDL 152 coupled to second components in the second stack layer 104B. The RDL 150 (e.g., a set of one or more redistribution layers) included in the first stack layer 104A may be electrically connected, via contacts 132, to each of the chiplets 110 included in the first stack layer 104A to provide conductive paths between acoustic resonators 112 of the chiplets 110. As an illustrative, non-limiting example, electrical interconnections included in the RDL 150 provide a conductive path 168A between the acoustic resonator 112A and the acoustic resonator 112B via a contact 132 of the chiplet 110A and a contact 132 of the chiplet 110B. Similarly, the second stack layer 104B includes the RDL 152 (e.g., a set of one or more redistribution layers) that may be electrically connected, via contacts 134, to each of the chiplets 120 included in the second stack layer 104B to provide conductive paths between acoustic resonators 122 of the chiplets 120. As an illustrative, non-limiting example, electrical interconnections included in the RDL 152 provide a conductive path 168B between the acoustic resonator 122A and the acoustic resonator 122B via a contact 134 of the chiplet 120A and a contact 134 of the chiplet 120B.

The resonator stack 102 also includes a set of through-mold vias (TMVs) 154 that extend through a mold compound 170 that at least partially encapsulates the chiplets 110 and the chiplets 120. The set of TMVs 154 include a set of through-mold conductors and may provide electrical interconnections between a first acoustic resonator 112 of a first chiplet 110 included in the first stack layer 104A and a second acoustic resonator 122 of a second chiplet 120 that is included in the second stack layer 104B. In the example of FIG. 1, a first TMV 154A and a second TMV 154B electrically connect the RDL 150 to the RDL 152 and provide signal paths between the acoustic resonators 122 of the chiplets 120 in the second stack layer 104B and the acoustic resonators 112 of the chiplets 110 in the first stack layer 104A, between the acoustic resonators 122 of the chiplets 120 in the second stack layer 104B and the external contacts 162, or both. For example, in FIG. 1, electrical interconnections included in the RDL 152, the TMV 154A, and the RDL 150 provide a conductive path 168C between the acoustic resonator 122A of the chiplet 120A and the acoustic resonator 112A of the chiplet 110A via the contacts

132 and 134, respectively. In some implementations, one or more of the chiplets 110 in the first stack layer 104A may further include one or more top electrical contacts that are electrically coupled to contacts on a bottom side of the RDL 152 to provide additional conductive paths to the one or more of the chiplets 120 via electrical interconnections included in the RDL 152.

The acoustic resonators 112 of the chiplets 110 are configured to cooperate to perform various operations. Similarly, the acoustic resonators 122 of the chiplets 120 are also configured to cooperate to perform various operations. For example, a diagram 140 illustrates that components of the chiplets 110 may be electrically interconnected to form a first filter circuit 142 of the resonator stack 102, and components of the chiplets 120 may be electrically interconnected to form a second filter circuit 144 of the resonator stack 102. As illustrated, the first filter circuit 142 includes the acoustic resonator 112A of the chiplet 110A and the acoustic resonator 112B of the chiplet 110B, and may also one or more additional acoustic resonators 112 of the chiplets 110, such as the acoustic resonator 112C. According to an aspect, the first filter circuit 142 is configured to operate as a broadband filter that filters a first input signal received at a filter input 184A to generate a first output signal at a filter output 186A. Similarly, the second filter circuit 144 includes acoustic resonators 122 of the chiplets 120 in the second stack layer 104B and may be configured to operate as a broadband filter that filters a second input signal received at a filter input 184B to generate a second output signal at a filter output 186B. An illustrative example in which acoustic resonators are interconnected according to a ladder-type bandpass filter topology is described further with reference to FIG. 2.

Optionally, the first filter circuit 142 and the second filter circuit 144 are interconnected, and acoustic resonators 112 of the chiplets 110 are configured to cooperate with the acoustic resonators 122 of the chiplets 120 to perform various operations. For example, as indicated by dashed lines, the filter input 184A may be electrically connected to the filter input 184B to form a common input 184, and the filter output 186A may be electrically connected to the filter output 186B to form a common output 186, so that the first filter circuit 142 and the second filter circuit 144 operate as parallel paths of a single filter circuit. Alternatively, or additionally, in some implementations one or more components (e.g., the acoustic resonator 112B) of the first filter circuit 142 may be electrically connected to one or more components (e.g., the acoustic resonator 122B) of the second filter circuit 144.

The first acoustic resonator 112A and the second acoustic resonator 112B are each schematically depicted as having a "sandwich"-type structure including an acoustic layer 190 (e.g., a piezoelectric material such as an aluminum nitride (AlN) layer, an aluminum scandium nitride (AlScN) layer, or a zinc oxide (ZnO) layer, as illustrative, non-limiting examples) between a first metal layer 192 and a second metal layer 194, and is formed on or over a semiconductor 198 (e.g., a silicon substrate). As illustrated, the first acoustic resonator 112A includes a first acoustic layer 190A that has a first thickness (T1) 196A, and the second acoustic resonator 112B includes a second acoustic layer 190B that has a second thickness (T2) 196B that is different from the first thickness 196A. In a conventional acoustic device in which multiple acoustic resonators are formed on a single wafer, process constraints limit an amount of variation that can be applied to the thicknesses of the acoustic layers. As explained in further detail with reference to FIG. 5, because the resonant frequency of each acoustic resonator is inversely proportional to the thickness of the acoustic layer, acoustic resonators in a conventional acoustic devices are limited to a narrow range of resonant frequencies; as a result, bandpass filters formed using such conventional acoustic resonators are limited to relatively narrowband filters.

In contrast to such conventional acoustic devices, the acoustic resonator 112A and the acoustic resonator 112B can be formed from different wafers. As a result, the acoustic layer 190A may have a significantly different thickness and/or may be formed of a different material than the acoustic layer 190B. For example, the second thickness 196B can differ from the first thickness 196A by at least a factor of two—e.g., T2 may be twice as large T1, three times as large as T1, etc.,—and the resonant frequency 114A of the acoustic resonator 112A may therefore differ significantly from the resonant frequency 114B of the acoustic resonator 112B. Because the use of chiplets 110A, 110B formed from different wafers enable a much wider range of resonant frequencies than are available for conventional acoustic devices from a single wafer, the first filter circuit 142 can function as a broadband filter with suitable characteristics for use with various wireless applications, such as 4G Long Term Evolution (LTE), 5G new radio (NR), WI-FI 6, and/or WI-FI 7, as illustrative non-limiting examples. (LTE is a trademark of European Telecommunications Standards Institute; WI-FI is a registered trademark of the Wi-Fi Alliance Corp., a California corporation).

Although the first filter circuit 142 is illustrated using the acoustic resonator 112A having a first resonant frequency 114A and the acoustic resonator 112B having a second resonant frequency 114B that is different from the first resonant frequency 114A, it should be understood that one or more additional chiplets included in the resonator stack 102 may have acoustic resonators 112 or 122 having resonant frequencies 114 or 124 that are different from both the first resonant frequency 114A and the second resonant frequency 114B. For example, each of the chiplets 110 may include acoustic resonators 112 having different resonant frequencies 114 than the acoustic resonators 112 of each of the other chiplets 110.

The diagram illustrated in FIG. 1 is merely schematic, and is intended to highlight particular features of the device 100. For example, the specific number of stack layers 104 of the resonator stack 102 is merely illustrative, and not limiting; in other implementations, the resonator stack 102 may include a single stack layer 104 or may include three or more stack layers 104. As another example, the number of chiplets illustrated in each stack layer 104 is merely illustrative, and not limiting; in other implementations, each stack layer 104 may include one, two, eight, or any other number of chiplets. The specific number of contacts and interconnections is merely illustrative, and not limiting. In general, each chiplet 110, 120 may include two, three, four, ten, or any other number of contacts. Likewise, the device 100 may include any number of external contacts 162. Further, certain internal structures have been omitted from FIG. 1. For example, the RDLs 150, 152 may include internal conductive traces and vias that are interconnected to form conductive paths. Similarly, the substrate 108 generally also includes internal conductive traces and vias that are interconnected to form conductive paths to the external contacts 162. The substrate 108 can also include other internal features (e.g., embedded cores, embedded passive devices, etc.), other external features (e.g., landside passive devices), or both. In some implementations, the substrate 108 may be omitted; for example, the external contacts 162 may be connected to a bottom surface of the RDL 150. Further, in FIG. 1, interconnections between the chiplets (e.g., to form the conductive paths 168) and the RDLs 150, 152 may be formed using solder bumps or using other techniques (in addition to or instead of solder bumps), such as copper pillars or pad-to-pad bonding.

In addition to the benefits described above arising from using chiplets from different wafers having acoustic layers 190 of varying thickness and/or materials to obtain a greater range of resonant frequencies 114, 124, forming each stack layer 104 using chiplets arranged and interconnected as a 3D stacked IC can provide various other benefits as compared to providing the same functional circuitry in one monolithic chip. For example, each chiplet is smaller than a single monolithic die including all of the same components (e.g., acoustic resonators) would be. Since yield loss (and costs due to yield lost) in IC manufacturing tends to increase as the die size increases, using smaller dies can reduce yield loss (i.e., increase yield) of the IC manufacturing process. Another benefit is that the chiplets can be fabricated in different locations and/or by different manufacturers, and in some cases, using different fabrication technologies (e.g., different fabrication technology nodes). In contrast to using a single monolithic die, when using chiplets, different chiplets can be manufactured using different fabrication technologies (e.g., different fabrication technology nodes), and only the chiplet or chiplets that include the most complex components are subjected to the tightest manufacturing constraints. In this arrangement, chiplets fabricated using less expensive and/or higher yield fabrication technologies can be integrated with chiplets fabricated using more expensive and/or lower yield fabrication technologies to form the device 100, resulting in overall savings. Still further, in some cases, as technology improves, the design of a chiplet can be changed. Chiplet stacking allows such new chiplet designs to be integrated with older chiplet designs to form stacked IC devices, which improves manufacturing flexibility and reduces design costs.

Figure 2:
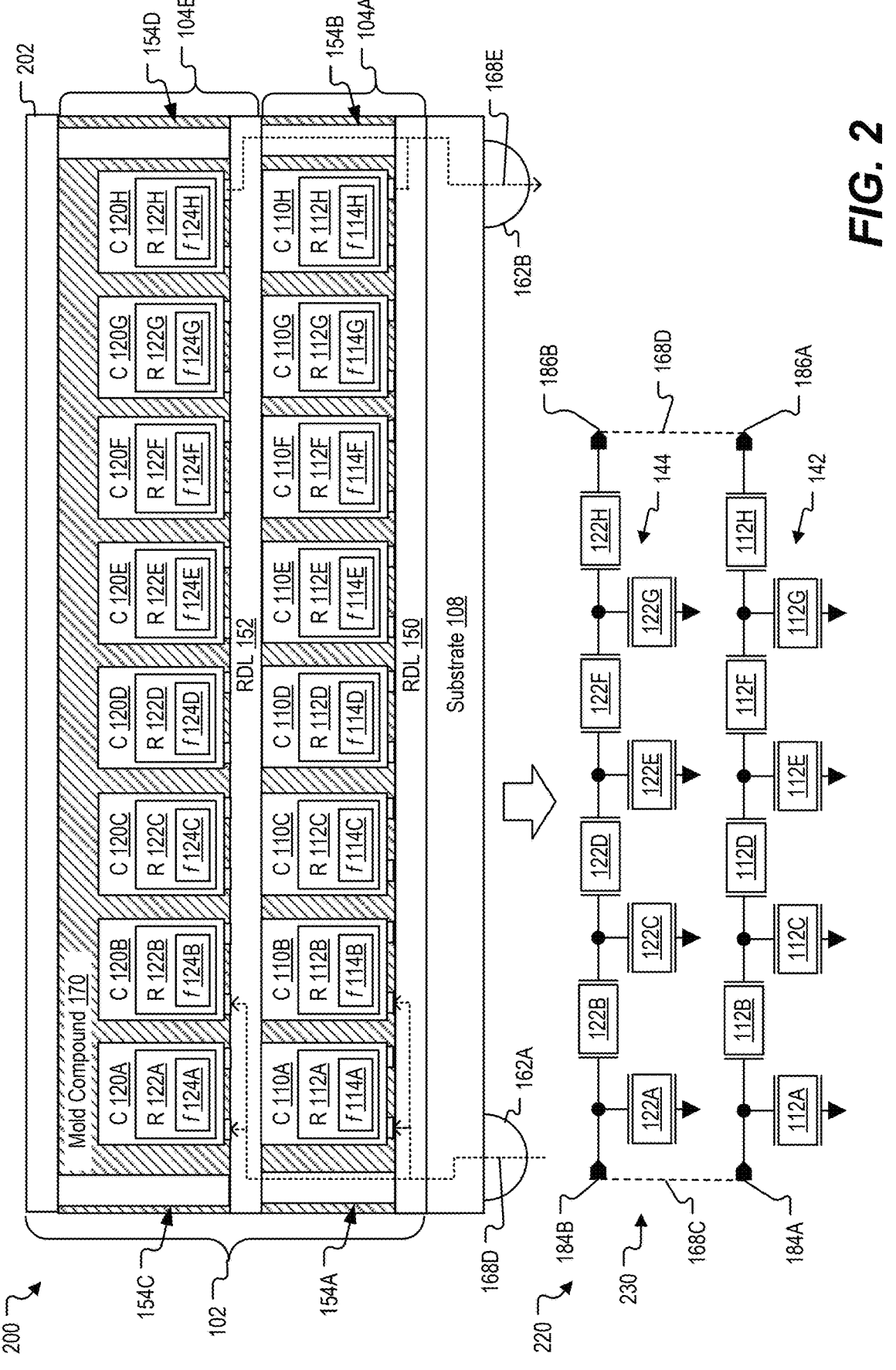
FIG. 2 illustrates a schematic cross-sectional view of another example of the exemplary integrated device of FIG. 1.

FIG. 2 illustrates a schematic cross-sectional view of an example of an exemplary integrated device 200. The integrated device 200 of FIG. 2 is one example of the device 100 of FIG. 1. As such, the integrated device 200 of FIG. 2 includes each of the components and features of the device 100 of FIG. 1. Certain of such components and features are not shown in or not called out in FIG. 2 in order to highlight other components and features. Where components and features of the device 100 of FIG. 1 are called out in FIG. 2, the same reference numbers used in FIG. 1 are used.

The first stack layer 104A of the resonator stack 102 includes the chiplet 110A including the acoustic resonator 112A having the resonant frequency 114A, the chiplet 110B including the acoustic resonator 112B having the resonant frequency 114B, the chiplet 110C including the acoustic resonator 112C having the resonant frequency 114C, a chiplet 110D including an acoustic resonator 112D having a resonant frequency 114D, a chiplet 110E including an acoustic resonator 112E having a resonant frequency 114E, a chiplet 110F including an acoustic resonator 112F having a resonant frequency 114F, a chiplet 110G including an acoustic resonator 112G having a resonant frequency 114G, and a chiplet 110H including an acoustic resonator 112H having a resonant frequency 114H. The second stack layer 104B includes the chiplet 120A including the acoustic resonator 122A having the resonant frequency 124A, the chiplet 120B including the acoustic resonator 122B having the resonant frequency 124B, the chiplet 120C including the acoustic resonator 122C having the resonant frequency 124C, a chiplet 120D including an acoustic resonator 122D having a resonant frequency 124D, a chiplet 120E including an acoustic resonator 122E having a resonant frequency 124E, a chiplet 120F including an acoustic resonator 122F having a resonant frequency 124F, a chiplet 120G including an acoustic resonator 122G having a resonant frequency 124G, and a chiplet 120H including an acoustic resonator 122H having a resonant frequency 124H.

Any one or more of the chiplets 110 in the first stack layer 104A may be from a different wafer as any one or more, or all, of the other chiplets 110 in the first stack layer 104A. Similarly, any one or more of the chiplets 120 in the second stack layer 104B may be from a different wafer as any one or more, or all, of the other chiplets 120 in the second stack layer 104B and/or from a different wafer as any one or more, or all, of the chiplets 110 in the first stack layer 104A. As a result, the acoustic resonators 112, 122 may exhibit a large range of resonant frequencies 114, 124, which may be selected in accordance with a design of a filter circuit that includes the acoustic resonators 112, 122 (e.g., to achieve particular filter properties, such as cutoff frequencies associated with a passband).

The second stack layer 104B also includes a TMV 154C and a TMV 154D that may electrically connect the RDL 152 to a cap layer 202. The cap layer 202 can include a passivation layer and is formed on an upper surface of the mold compound 170 of the second stack layer 104B. The cap layer 202 may include one or more dielectric layers and, according to some aspects, may also include one or more electrical interconnections and/or contacts of one or more redistribution layers to provide conductive paths to one or more additional devices mounted on the cap layer 202, such as described in further detail with reference to FIG. 3.

In the example of FIG. 2, electrical interconnections included in the RDL 152, the TMV 154A, and the RDL 150 provide a conductive path 168D between an external contact 162A, the acoustic resonator 122A of the chiplet 120A, the acoustic resonator 122B of the chiplet 120B, the acoustic resonator 112A of the chiplet 110A, and the acoustic resonator 112B of the chiplet 110B. Electrical interconnections included in the RDL 152, the TMV 154B, and the RDL 150 provide a conductive path 168E between the acoustic resonator 122H of the chiplet 120H, the acoustic resonator 112H of the chiplet 110H, and an external contact 162B.

A circuit diagram 220 depicts an example of a filter circuit 230 that includes a ladder-type bandpass filter formed from the electrical interconnection of the acoustic resonators 112, 122. For example, the filter circuit 230 includes the first filter circuit 142 having a ladder-type topology formed of the acoustic resonators 112A-H of the first stack layer 104A. The filter circuit 230 also includes the second filter circuit 144 arranged in parallel with the first filter circuit 142 and having the ladder-type topology formed of the acoustic resonators 122A-H of the second stack layer 104B.

The filter input 184A of the first filter circuit 142 is electrically connected to the filter input 184B of the second filter circuit 144 via the conductive path 168D, which enables an input signal received at the external contact 162 to be conveyed to the acoustic resonators 112A and 112B of the first filter circuit 142 and to the acoustic resonators 122A and 122B of the second filter circuit 144. Similarly, the filter output 186A of the first filter circuit 142 is electrically connected to the filter output 186B of the second filter circuit 144 via the conductive path 168E, which enables an output signal of the first filter circuit 142 and the second filter circuit 144 to be conveyed to the external contact 162B as an output signal.

The diagram illustrated in FIG. 2 is merely schematic, and is intended to highlight particular features of the integrated device 200. For example, the specific number of stack layers, chiplets included in each stack layer, contacts, and interconnections are merely illustrative, and not limiting. Further, certain internal structures have been omitted from FIG. 2. For example, the redistribution layers 150, 152, and the substrate 108 include internal conductive traces and vias that are interconnected to form conductive paths. Further, in FIG. 2, interconnections between the chiplets and the RDLs 150, 152 may be formed using solder bumps or using other techniques (in addition to or instead of solder bumps).

Figure 3:
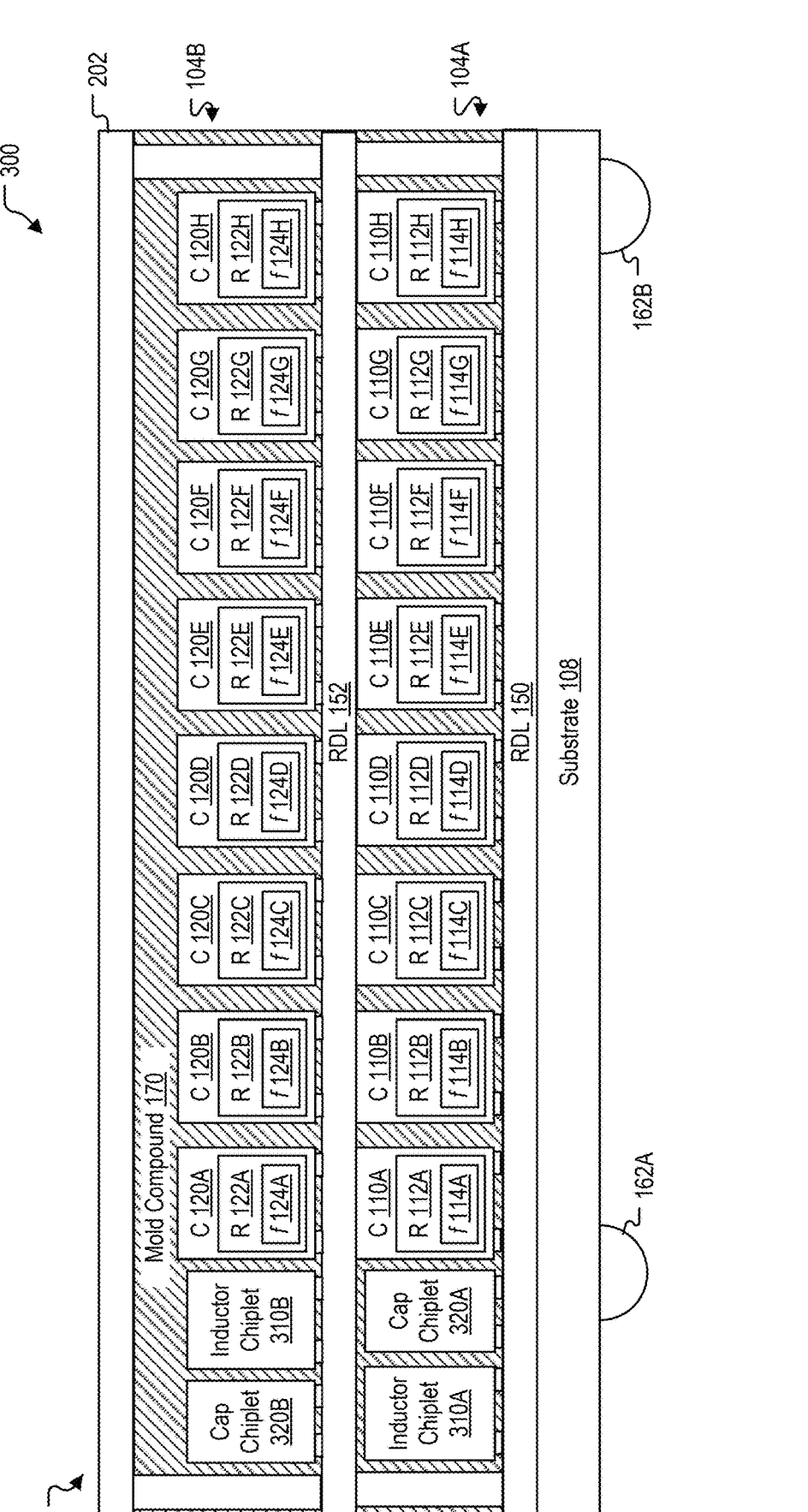
FIG. 3 illustrates a schematic cross-sectional view of another example of the exemplary integrated device of FIG. 1.

FIG. 3 illustrates a schematic cross-sectional view of an example of an exemplary integrated device 300. The integrated device 300 of FIG. 3 is one example of the device 100 of FIG. 1. As such, the integrated device 300 of FIG. 3 includes each of the components and features of the device 100 of FIG. 1, and may include one or more of the components and features of the device 200 of FIG. 2. Certain of such components and features are not shown in or not called out in FIG. 3 in order to highlight other components and features. Where components and features of the device 100 of FIG. 1 or the device 200 of FIG. 2 are called out in FIG. 3, the same reference numbers used in FIG. 1 and/or FIG. 2 are used.

In FIG. 3, the resonator stack 102 includes the chiplets 110 in the first stack layer 104A, the chiplets 120 in the second stack layer 104B, and one or more additional components, such as one or more inductor chiplets 310, one or more capacitor chiplets 320, or a combination thereof. As illustrated, the first stack layer 104A includes an inductor chiplet 310A and a capacitor chiplet 320A, and the second stack layer 104B includes an inductor chiplet 310B and a capacitor chiplet 320B. Each inductor chiplet 310 can include multiple inductors, such as an array of inductors that are configured to be coupled to one or more of the acoustic resonators to provide impedance-matching inductance or inductance(s) associated with one or more particular filter designs. Similarly, each capacitor chiplet 320 can include multiple capacitors, such as an array of capacitors that are configured to be coupled to one or more of the acoustic resonators to provide impedance-matching capacitance or capacitance(s) associated with the one or more particular filter designs.

In a particular example, inductors of the inductor chiplet 310A can be electrically connected to one or more of the acoustic resonators 112 in the first stack layer 104A and/or to one or more capacitors of the capacitor chiplet 320A through the RDL 150. Capacitors of the capacitor chiplet 320A can be electrically connected to one or more of the acoustic resonators 112 in the first stack layer 104A and/or to one or more inductors of the inductor chiplet 310A through the RDL 150. Likewise, inductors of the inductor chiplet 310B can be electrically connected to one or more of the acoustic resonators 122 in the second stack layer 104B and/or to one or more capacitors of the capacitor chiplet 320B through the RDL 152, while capacitors of the capacitor chiplet 320B can be electrically connected to one or more of the acoustic resonators 122 in the second stack layer 104B and/or to one or more inductors of the inductor chiplet 310B through the RDL 152. In this example, the inductor chiplet 310A and the capacitor chiplet 320A can be used to provide passive components to obtain first particular filter characteristics of the first filter circuit 142, and the inductor chiplet 310B and the capacitor chiplet 320B can be used to provide passive components to obtain second particular filter characteristics of the second filter circuit 144.

Alternatively, or in addition, inductors of the inductor chiplet 310A and/or capacitors of the capacitor chiplet 320A in the first stack layer 104A may be electrically connected to one or more components in the second stack layer 104B. Similarly, inductors of the inductor chiplet 310B and/or capacitors of the capacitor chiplet 320B in the second stack layer 104B may be electrically connected to one or more components in the first stack layer 104A. For example, electrical interconnections between inductors of the inductor chiplet 310A and/or capacitors of the capacitor chiplet 320A and one or more components of the second stack layer 104B, electrical interconnections between inductors of the inductor chiplet 310B and/or capacitors of the capacitor chiplet 320B and one or more components of the first stack layer 104A, or any combination thereof, may be provided though the RDL 150, the RDL 152, and the TMVs 154.

Although FIG. 3 illustrates the inductor chiplet 310A adjacent to the capacitor chiplet 320A and the inductor chiplet 310B adjacent to the capacitor chiplet 320B, in other implementations the inductor chiplet 310A and the capacitor chiplet 320A are not adjacent to each other, the inductor chiplet 310B and the capacitor chiplet 320B are not adjacent to each other, or both. Generally, each inductor chiplet 310 and each capacitor chiplet 320 may be positioned at any location in the resonator stack 102, which may be determined based on one or more considerations such as routing complexity and/or parasitic effects due to line length, as illustrative, non-limiting examples.

Although FIG. 3 depicts an example in which each stack layer 104 of the resonator stack 102 includes an inductor chiplet 310 and a capacitor chiplet 320, in other implementations one or more (or all) of the stack layers 104 may include multiple inductor chiplets 310 or may not include any inductor chiplets 310, one or more (or all) of the stack layers 104 may include multiple capacitor chiplets 320 or may not include any capacitor chiplets 320, or a combination thereof.

The diagram illustrated in FIG. 3 is merely schematic, and is intended to highlight particular features of the integrated device 300. For example, the specific number of stack layers, chiplets included in each stack layer, contacts, and interconnections are merely illustrative, and not limiting. Further, certain internal structures have been omitted from FIG. 3. For example, the redistribution layers 150, 152, and the substrate 108 include internal conductive traces and vias that are interconnected to form conductive paths. Further, in FIG. 3, interconnections between the chiplets and the RDLs 150, 152 may be formed using solder bumps or using other techniques (in addition to or instead of solder bumps).

Figure 4:
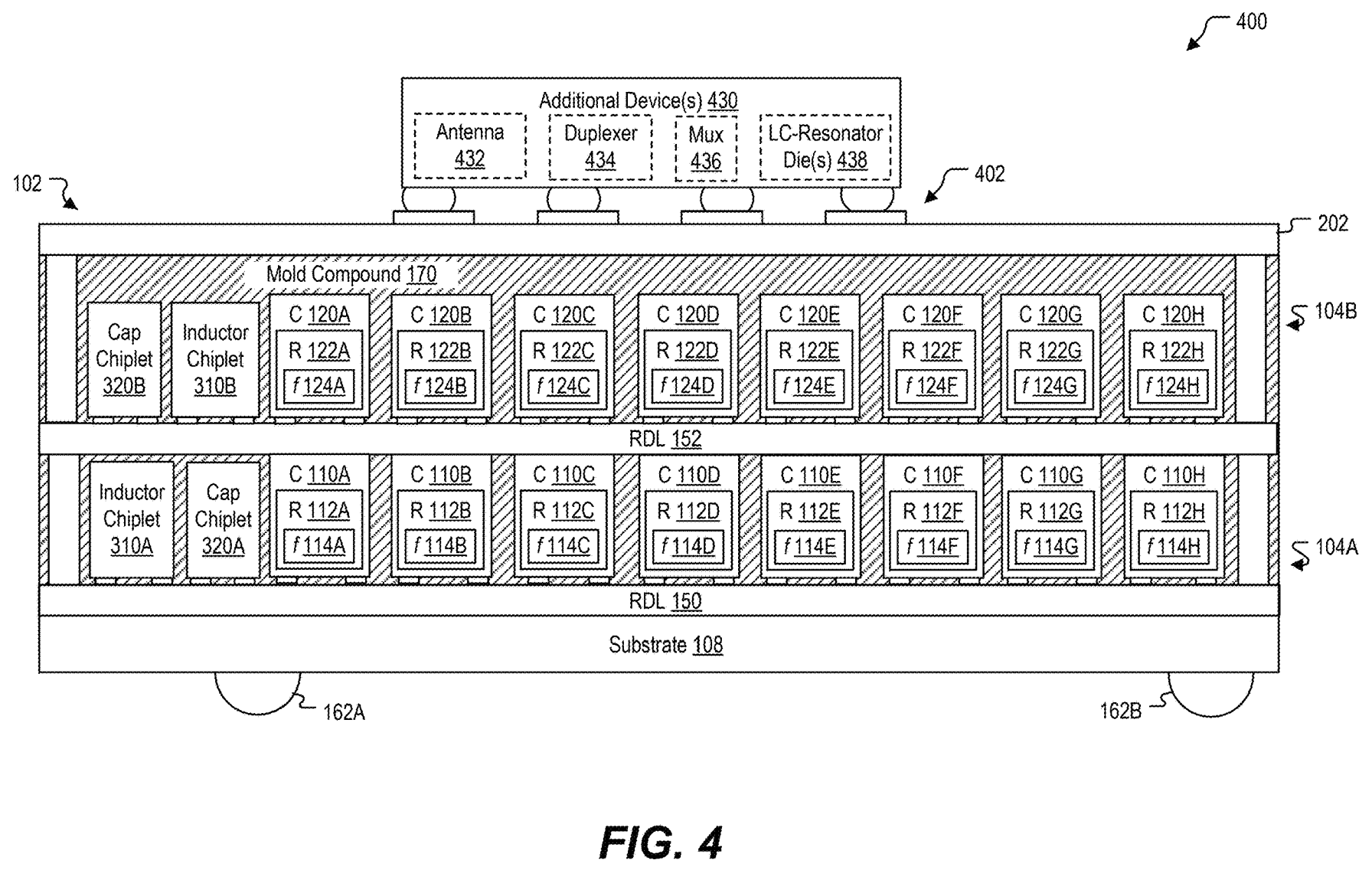

FIG. 4 illustrates a schematic cross-sectional view of an example of an exemplary integrated device 400. The integrated device 400 of FIG. 4 is one example of the device 100 of FIG. 1. As such, the integrated device 400 of FIG. 4 includes each of the components and features of the device 100 of FIG. 1, and may include one or more of the components and features of the device 200 of FIG. 2 and/or of the device 300 of FIG. 3. Certain of such components and features are not shown in or not called out in FIG. 4 in order to highlight other components and features. Where components and features of the device 100 of FIG. 1, the device 200 of FIG. 2, or the device 300 of FIG. 3 are called out in FIG. 4, the same reference numbers are used as in the prior figure(s).

In FIG. 4, the device 400 includes the resonator stack 102, and one or more additional devices 430 disposed above (in the orientation illustrated in FIG. 4) the resonator stack 102. The additional devices 430 can include or correspond to other dies, passive electrical components (e.g., capacitors, inductors, etc.), interposer devices, or combinations thereof. The additional device(s) 430 can be electrically connected to one or more components of the resonator stack 102, such as one or more of the chiplets 110, one or more of the chiplets 120, one or more of the inductor chiplets 310, one or more of the capacitor chiplets 320, or any combination thereof, via contacts of the additional device(s) 430, one or more conductive contacts 402 on the resonator stack 102, conductors of the cap layer 202, the TMVs 154, conductors of the RDL 152, conductors of the RDL 150, or any combination thereof. According to an aspect, the additional device(s) 430 may further be electrically connected to one or more of the external contacts 162 to provide a signal propagation path between an external contact 162 and the additional device(s) 430.

In an example, the additional device(s) 430 include one or more antennas, such as a representative antenna 432, that is electrically connected to a filter circuit of the resonator stack 102. For example, the antenna 432 may be coupled to an input or an output of the first filter circuit 142, an input or an output of the second filter circuit 144, an input or an output of the filter circuit 230, or any combination thereof. To illustrate, the filter circuit of the resonator stack 102 may be included in, or coupled to, a radiofrequency front-end frequency circuit.

According to an aspect, the filter circuit can be coupled to or included in a duplexer. For example, the additional device(s) 430 may include at least a portion of a duplexer 434 coupled to the antenna 432. In a particular implementation, the filter circuit can be coupled to a multiplexor that is further coupled to inductor-capacitor (LC)-resonator dies of the radiofrequency front-end filtering circuit. For example, the additional device(s) 430 may include a multiplexor 436, one or more LC-resonator dies 438, or both, which may in turn be coupled to the antenna 432.

The diagram illustrated in FIG. 4 is merely schematic, and is intended to highlight particular features of the integrated device 400. For example, the specific type and number of the additional device(s) 430 and the specific number of stack layers, chiplets included in each stack layer, contacts, and interconnections are merely illustrative, and not limiting. Further, certain internal structures have been omitted from FIG. 4. For example, the cap layer 202, the redistribution layers 150, 152, and the substrate 108 include internal conductive traces and vias that are interconnected to form conductive paths. Further, in FIG. 4, interconnections between the additional device(s) 430 and conductors of the cap layer 202, and interconnections between the chiplets and the RDLs 150, 152 may be formed using solder bumps or using other techniques (in addition to or instead of solder bumps).

Figure 5:
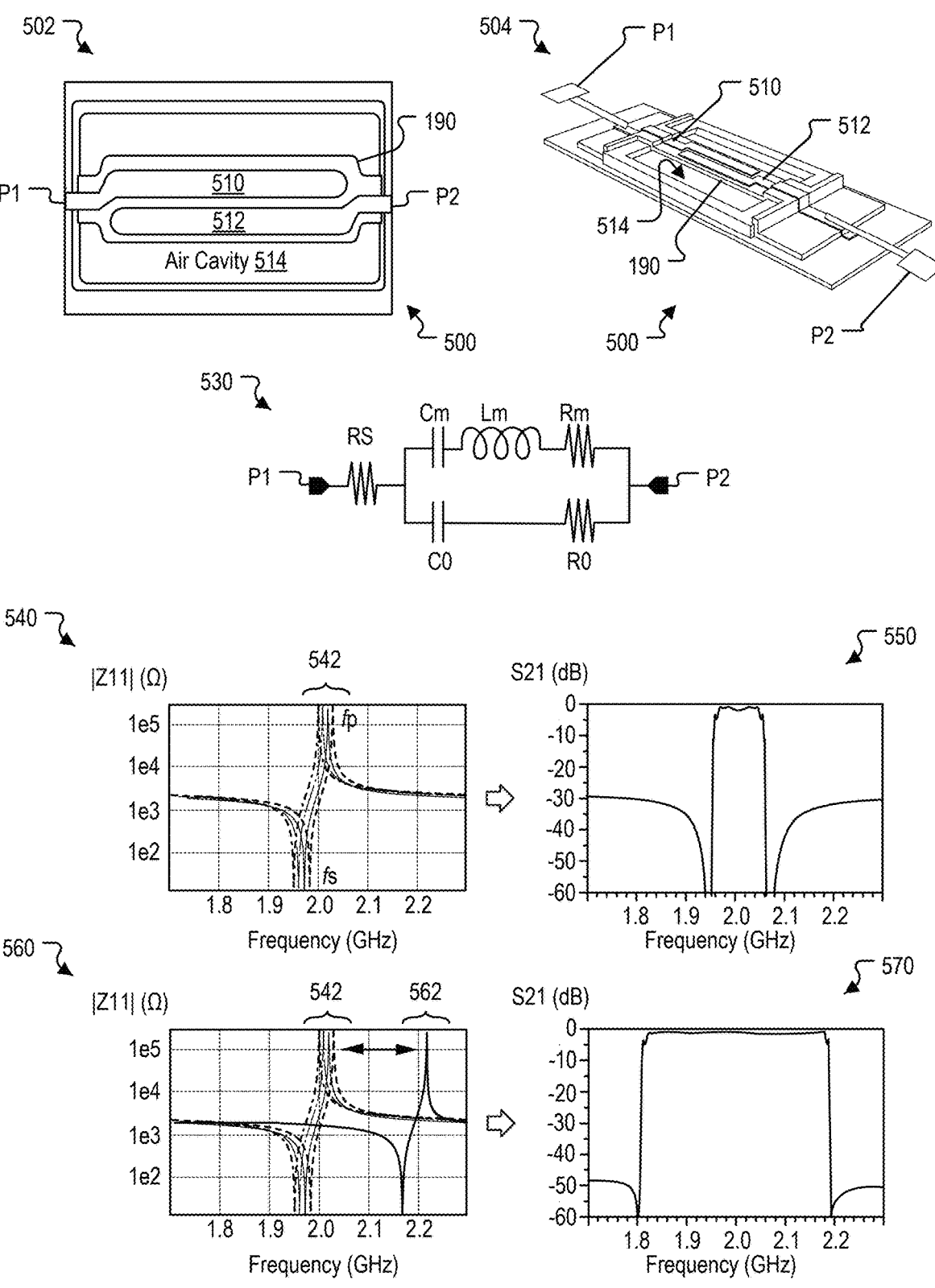
FIG. 5 illustrates schematic views and circuit characteristics associated with exemplary acoustic resonators that may be included in the exemplary integrated device of FIG. 1.

FIG. 5 depicts a particular example of characteristics of an exemplary acoustic resonator 500 that may be included in the resonator stack 102 and exemplary filter characteristics of a filter circuit that includes the exemplary acoustic resonator 500. According to an aspect, the acoustic resonator 500 corresponds to one or more of the acoustic resonators 112, one or more of the acoustic resonators 122, or a combination thereof.

A physical structure of the acoustic resonator 500 as a "contour-mode"-type resonator is depicted in schematic top view 502 and a schematic perspective view 504 of the acoustic resonator 500. The acoustic resonator 500 includes an acoustic layer 190 positioned above an air cavity 514. A first conductor 510 and a second conductor 512 extend along a top surface of the acoustic layer 190 in a side-by-side arrangement that enables piezoelectric coupling between the first conductor 510 and the second conductor 512 via a third conductor (not shown) on a bottom surface of the acoustic layer 190. The first conductor 510 may be coupled to an external circuit via a first port P1, and the second conductor 512 may be coupled to the external circuit via a second port P2.

The acoustic resonator 500 may be modeled in the electrical domain as an equivalent circuit 530. The equivalent circuit 530 includes a series resistor RS, a first branch that includes a capacitor C0 and resistor R0, and a second branch that includes a motion capacitor Cm, a motion inductor Lm, and a motion resistor Rm. The motion inductor Lm and the motion capacitor Cm form a series resonator, and the motion inductor Lm and the capacitor C0 form a parallel resonator. The series resonator causes a lower peak in a corresponding impedance (Z11) plot 540 associated with a first resonant frequency fs, while the parallel resonator cause an upper peak associated with a second resonant frequency fp. Generally, a fundamental frequency of an acoustic resonator can be determined as:

$$f_0 = \frac{1}{2 \cdot t} \cdot \sqrt{\frac{E}{\rho}}$$

where t is the thickness of the acoustic layer, E designates Young's modulus, and ρ designates mass density.

In conventional devices, relatively small adjustments may be made to "tune" acoustic resonators made on a single die using an allowable range of thicknesses of the acoustic layer 190, resulting in an allowable range 542 of resonant frequencies of the acoustic resonators. Because the allowable range 542 of resonant frequencies is relatively narrow, the resulting filter characteristic for a ladder-type bandpass filter corresponds to a narrow passband, as illustrated in an amplitude response (S21) plot 550 of filter gain as a function of frequency.

However, by using acoustic resonators of multiple chiplets formed form different wafers, such as described with reference to FIG. 1, acoustic resonators of varying types and having acoustic layers 190 having varying thicknesses (e.g., by a factor of 2, 3, or more) can provide much larger range of resonant frequencies and a much wider passband when implemented a ladder-type bandpass filter. For example, a second impedance plot 560 illustrates that the range of resonant frequencies can extend from the range 542, corresponding to "tuning" various acoustic resonators on a single die or chiplet, to a second range 562 corresponding to one or more acoustic resonators on a separate die or chiplet. A corresponding second amplitude response plot 570 of the filter gain resulting from such acoustic resonators in a ladder-type bandpass filter demonstrates the wider passband (e.g., broadband filtering) as compared to the narrowband filtering exhibited in the amplitude response plot 550.

Although FIG. 5 illustrates the acoustic resonator 500 as a contour-mode resonator, in other examples one or more different types of acoustic resonators (e.g., the sandwich-type resonators depicted in FIG. 1 and/or other resonator types) may be used in one or more of the chiplets 110 and/or the chiplets 120 instead of, or in addition to, contour-mode resonators. In general, such acoustic resonators can include one or more variations of surface acoustic wave (SAW) resonators, bulk acoustic wave (BAW) resonators, film bulk acoustic wave (FBAR) resonators, one or other types of acoustic resonators, or any combination thereof. Although examples of various values, ranges, and characteristics are depicted in the plots 540, 550, 560, and 570, such exemplary values, ranges, and characteristics are provided for purpose of illustration rather than limitation, and other values, ranges, and configurations may result from use of acoustic resonators having different types, different material properties, different sizes and dimensions, etc., as compared to the provided examples.

First Exemplary Sequence for Fabricating a Stacked Integrated Device

Figure 6:
FIG. 6 illustrates an exemplary sequence for fabricating the exemplary integrated device of FIG. 1.

FIG. 6 depicts a first example of a sequence 600 for providing or fabricating a stacked integrated device, as described with reference to any of FIGS. 1-4. It should be noted that the sequence 600 may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure.

In a first stage 610, multiple wafers 602 are provided, illustrated as a first wafer 602A and one or more additional wafers including an Nth wafer 602N. Each of the wafers 602 may exhibit one or more distinct characteristics as compared to the other wafers 602. For example, as illustrated, the first wafer 602A may include components (e.g., acoustic resonators, conductive lines, and/or other passive or active components) generated according to a premium node complementary metal-oxide semiconductor (CMOS) fabrication process, and the Nth wafer 602N may include components generated according to a nonpremium node CMOS fabrication process. According to some implementations, each of the wafers 602 includes acoustic resonators, and the thickness of the acoustic layer 190 (e.g., a thickness of an AlN or AlScN layer) is different for each of the wafers 602.

In a second stage 630, each of the wafers 602 is processed. As illustrated, wafer processing includes wafer thinning and dicing. For example, processing of the first wafer 602A includes performing a back-grind operation 634A to generate a first thinned wafer 632A that has a second thickness t2 that is less than a first thickness t1 of the first wafer 602A. A dicing operation 636A is performed on the first thinned wafer 632A to obtain multiple dies, such as a representative first die 640A.

Similar wafer processing may be performed on each of the other wafers. For example, processing of the Nth wafer 602N includes performing a back-grind operation 634N to generate an Nth thinned wafer 632N that has a fourth thickness t4 that is less than a third thickness t3 of the Nth wafer 602N. A dicing operation 636N is performed on the Nth thinned wafer 632N to obtain multiple dies, such as a representative Nth die 640N.

In a third stage 650, reconstitution and molding processing is performed to form a reconstituted wafer 660. In a first example, the reconstituted wafer 660 may be formed in a chip-first process in which one or more dies 640 from each of the wafers 602 are attached to a carrier or frame and a mold layer is applied, followed by formation of RDL layers and/or external connectors (e.g., solder bumps). In a second example, the reconstituted wafer 660 may be formed in a chip-last process in which RDL layers are formed on a carrier, the dies 640 are bonded to the RDL layers and a mold layer is applied, followed by removal of the carrier and optionally formation of external connectors. According to a particular aspect, each of the dies 640A-640N corresponds to one of the chiplets of the resonator stack 102 of FIGS. 1-4, such as one of the chiplets 110, one of the chiplets 120, one of the inductor chiplets 310, or one of the capacitor chiplets 320. The reconstituted wafer 660 also includes one or more RDL layers, such as the RDL 150 or the RDL 152 of FIG. 1, that provides interconnections between the dies 640A-640N.

A singulation process may be performed on the reconstituted wafer 660 to obtain individual integrated devices, such as a representative device 670 that corresponds to a reconstituted device that includes one or more (or all) of the dies 640. In the illustrated example, the device 670 includes the first die 640A, the second die 640B, and the Nth die 640N. According to an aspect, the device 670 corresponds to a stack layer 104 of the resonator stack 102, such as the first stack layer 104A or the second stack layer 104B.

The resonator stack 102 may be formed by stacking multiple devices formed in accordance with the sequence 600. For example, the device 670 may be formed as the first stack layer 104A, drilled and plated to generate the TMVs 154A-B, and another device corresponding to the second stack layer 104B (e.g., from the reconstituted wafer 660 or another reconstituted wafer) may be stacked on the device 670, such as by using microbumps or hybrid bonding to electrically interconnect the stack layers. In some implementations, this process may be repeated to add one or more additional stack layers 104 during formation of the resonator stack 102.

Although the sequence 600 includes forming the reconstituted wafer 660 and singulation of the reconstituted wafer 660 to form the device 670, in other implementations the device 670 may be formed without first forming the reconstituted wafer 660. Although the sequence 600 includes obtaining and processing the wafers 602 to form the dies 640, in other implementations, one or more (or all) of the dies 640 may instead be obtained from a supplier, and the first stage 610 and the second stage 630 may be omitted for those obtained dies 640.

Second Exemplary Sequence for Fabricating a Stacked IC Device

FIGS. 7A-7C illustrate an alternative exemplary sequence for providing or fabricating a stacked integrated device, as described with reference to any of FIGS. 1-4. In some implementations, the sequence of FIGS. 7A-7C may be used to provide (e.g., during fabrication of) one or more of the integrated devices 100, 200, 300, or 400 of FIGS. 1-4.

It should be noted that the sequence of FIGS. 7A-7C may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIGS. 7A-7C. Each of the various stages of the sequence illustrated in FIGS. 7A-7C shows a single integrated device being formed. In other implementations, multiple integrated devices can be formed together concurrently.

Stage 1 of FIG. 7A illustrates a state after formation of redistribution layers 704 on a substrate 702. In some implementations, the substrate 702 is a carrier substrate that is not included in a final device that includes a stacked integrated device (e.g., is not included in the device 700 illustrated at Stage 9 of FIG. 7C). In other implementations, the substrate 702 is a bottom substrate of the final device. For example, the substrate 702 can correspond to the substrate 108 of FIG. 1, and the redistribution layers 704 can correspond to the RDL 150 of FIG. 1. In some implementations, the redistribution layers 704 can be formed within the substrate 702. The redistribution layers 704 can be formed using various deposition and patterning operations to form alternating dielectric layers and metal layers where the metal layers are patterned to form traces and selected traces of one metal layer are electrically connected to corresponding selected traces of another metal layer to form signal paths.

Stage 2 illustrates a state after interconnect conductors 708 have been formed on the redistribution layers 704. For example, one or more plating processes and one or more patterning processes can be used to form the interconnect conductors 708. The interconnect conductors 708 include a metal, such as copper, silver, tin, another conductor, or an alloy or combination thereof. In a particular implementation, the interconnect conductors 708 correspond to the through-mold conductors of the TMVs 154A and 154B of any of FIGS. 1-4.

Stage 3 illustrates a state after chiplets 710A, 710B, 710C, and 710D are disposed on (e.g., attached to) the redistribution layers 704. At least two of the chiplets 710 include an acoustic resonator and are formed from different wafers. In a particular implementation, each of the chiplets 710 can correspond to one of the chiplets 110 of FIGS. 1-4, the inductor chiplet 310A of FIG. 3, or the capacitor chiplet 320A of FIG. 3. Each of the chiplets 710 can be positioned as illustrated at Stage 3 using an automated process, such as using a robot performing pick-and-place operations. In some implementations, the chiplets 710 are coupled to one or more contacts of the redistribution layers 704 using solder.

Stage 4 of FIG. 7B illustrates a state after a mold compound 718 has been used to at least partially encapsulate the chiplets 710. The mold compound 718 can include, correspond to, or be included within (e.g., represent a portion of) the mold compound 170 of any of FIGS. 1-4. In a particular example, a deposition process, a spin-on process, or a similar process can be used to apply the mold compound 718, and the mold compound 718 can subsequently be cured or hardened by exposure to light, heat, and/or chemical hardening agents.

Stage 5 illustrates a state after formation of redistribution layers 730 and formation of interconnect conductors 724. In a particular implementation, the redistribution layers 730 correspond to the RDL 152 of any of FIGS. 1-4, and the interconnect conductors 724 correspond to the through-mold conductors of the TMVs 154C and 154D of FIGS. 2-4. The redistribution layers 730 can be formed using various deposition and patterning operations to form alternating dielectric layers and metal layers where the metal layers are patterned to form traces and selected traces of one metal layer are electrically connected to corresponding selected traces of another metal layer to form signal paths. One or more plating processes and one or more patterning processes can be used to form the interconnect conductors 724 on the redistribution layers 730. The interconnect conductors 724 include a metal, such as copper, silver, tin, another conductor, or an alloy or combination thereof.

Stage 6 illustrates a state after chiplets 720A, 720B, 720C, and 720D are disposed on (e.g., attached to) the redistribution layers 730. At least two of the chiplets 720 include an acoustic resonator and are formed from different wafers. In a particular implementation, each of the chiplets 720 can correspond to one of the chiplets 120 of FIGS. 1-4, the inductor chiplet 310B of FIG. 3, or the capacitor chiplet 320B of FIG. 3. Each of the chiplets 720 can be positioned as illustrated at Stage 6 using an automated process, such as using a robot performing pick-and-place operations. In some implementations, the chiplets 720 are coupled to one or more contacts of the redistribution layers 730 using solder. The redistribution layers 730 are electrically connected to the interconnect conductors 708 and to the interconnect conductors 724 and provide signal paths to each of the chiplets 720.

Stage 7 of FIG. 7C illustrates a state after a mold compound 770 has been used to at least partially encapsulate the chiplets 720. The mold compound 770 can include, correspond to, or be included within (e.g., represent a portion of) the mold compound 170 of any of FIGS. 1-4. In a particular example, a deposition process, a spin-on process, or a similar process can be used to apply the mold compound 770, and the mold compound 770 can subsequently be cured or hardened by exposure to light, heat, and/or chemical hardening agents.

Stage 8 illustrates a state after a cap layer 772 is formed on or coupled to the assembled components of Stage 7. The cap layer 772 can correspond to the cap layer 202 of FIGS. 2-4. In some implementations, such as when one or more additional devices (e.g., the additional device(s) 430 of FIG. 4) are to be attached to the cap layer 772, the cap layer 772 is formed using various deposition and patterning operations to form alternating dielectric layers and metal layers where the metal layers are patterned to form traces and selected traces of one metal layer are electrically connected to corresponding selected traces of another metal layer to form signal paths.

Stage 9 illustrates a state after solder balls 750 have been attached to the substrate 702. In a particular implementation, the solder balls 750 correspond to the external contacts 162 of FIGS. 1-4. If multiple instances of the device 700 are being formed concurrently, individualization operations (e.g., cutting to separate the devices) can also be performed between Stages 8 and 9. Formation of the devices 700 is complete after Stage 9 of FIG. 7C. However, in some implementations, one or more additional devices (e.g., the additional device(s) 430 of FIG. 4) are also attached to the cap layer 772. In some implementations, one or more additional stack layers may be added to the device 700 by repeating the processing of Stages 5-8 for each additional stack layer prior to advancing to Stage 8.

Exemplary Flow Diagram of a Method for Fabricating a Stacked Integrated Device In some implementations, fabricating a stacked integrated device includes several processes. FIG. 8 illustrates an exemplary flow diagram of a method 800 for providing or fabricating a stacked IC device. In some implementations, the method 800 of FIG. 8 may be used to provide or fabricate any of the stacked integrated devices 100, 200, 300, or 400 of FIGS. 1-4.

It should be noted that the method 800 of FIG. 8 may combine one or more processes in order to simplify and/or clarify the method for providing or fabricating an integrated device. In some implementations, the order of the processes may be changed or modified.

The method 800 includes, at block 802, placing a first chiplet with a first acoustic resonator having a first resonant frequency on a substrate. For example, the first chiplet can correspond to the first chiplet 110A of any of FIGS. 1-4. For example, placing the first chiplet can be performed in accordance with the reconstitution and molding processing of the third stage 650 of FIG. 6 or in accordance with Stage 3 of FIG. 7A.

The method 800 also includes, at block 804, placing a second chiplet with a second acoustic resonator having a second resonant frequency on the substrate. For example, the second chiplet can correspond to the second chiplet 110B of any of FIGS. 1-4. For example, placing the second chiplet can be performed in accordance with the reconstitution and molding processing of the third stage 650 of FIG. 6 or in accordance with Stage 3 of FIG. 7A. In a particular implementation, the first chiplet is formed from a first wafer, and the second chiplet is formed from a second wafer that is different from the first wafer.

The method 800 also includes, at block 806, electrically connecting the first chiplet and the second chiplet to provide a conductive path between the first acoustic resonator and the second acoustic resonator. For example, conductors of the RDL 150 of FIG. 1 electrically connect the chiplet 110A to the chiplet 110B to provide the conductive path 168A between the first acoustic resonator 112A and the second acoustic resonator 112B.

In some implementations, the method 800 also includes disposing a mold compound that at least partially encapsulates the first chiplet and the second chiplet in a first stack layer of a resonator stack. For example, the mold compound can correspond to the mold compound 170 of FIGS. 1-4 and/or may be disposed in accordance with the description of Stage 4 of FIG. 7B.

The method 800 may also include forming a second stack layer of the resonator stack on the first stack layer, the second stack layer including a third acoustic resonator having a third resonant frequency and a fourth acoustic resonator having a fourth resonant frequency. For example, the second stack layer 104B of the resonator stack 102 may be formed as a reconstituted device and stacked on the first stack layer 104A as described in FIG. 6, or alternatively may be formed on the first stack layer 104A as described in FIGS. 7B and 7C. The third acoustic resonator can correspond to the acoustic resonator 122A included in the chiplet 120A and having the resonant frequency 124A, and the fourth acoustic resonator can correspond to the acoustic resonator 122B included in the chiplet 120B and having the resonant frequency 124B.

Exemplary Electronic Devices

Figure 9:
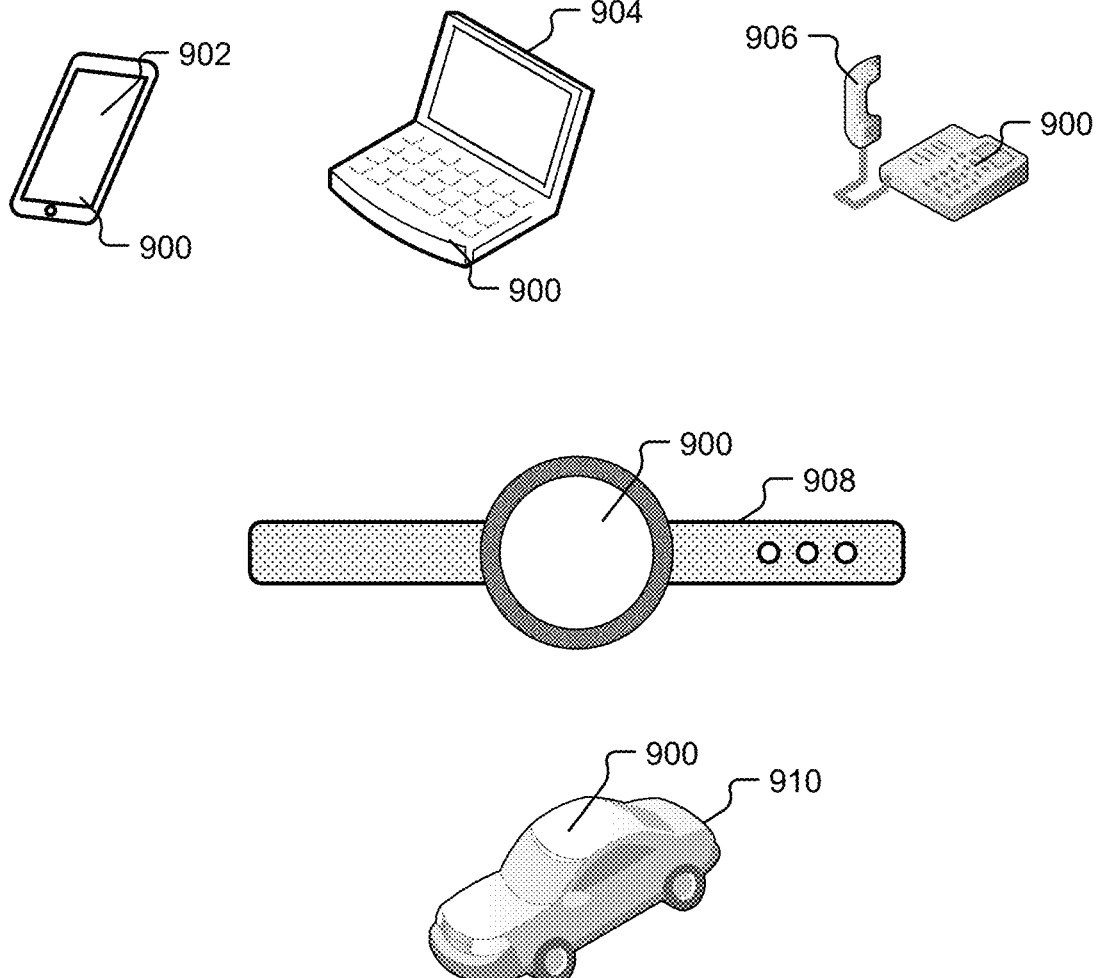
FIG. 9 illustrates various electronic devices that may integrate a die, an electronic circuit, an integrated device, an integrated passive device (IPD), a passive component, a package, and/or a device package described herein.

FIG. 9 illustrates various electronic devices that may include or be integrated with any of the stacked integrated devices 100, 200, 300, 400 of any of FIGS. 1-4. For example, a mobile phone device 902, a laptop computer device 904, a fixed location terminal device 906, a wearable device 908, or a vehicle 910 (e.g., an automobile or an aerial device) may include a device 900. The device 900 can include, for example, any of the devices 100, 200, 300, 400 described herein. The devices 902, 904, 906 and 908 and the vehicle 910 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1-9 may be rearranged and/or combined into a single component, process, feature, or function or embodied in several components, processes, or functions. Additional elements, components, processes, and/or functions may also be added without departing from the disclosure. It should also be noted FIGS. 1-9 and its corresponding description in the present disclosure is not limited to dies and/or ICs. In some implementations, FIGS. 1-9 and its corresponding description may be used to manufacture, create, provide, and/or produce devices and/or integrated devices. In some implementations, a device may include a die, an integrated device, an integrated passive device (IPD), a die package, an IC device, a device package, an IC package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first," "second," "third," and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate," "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, a device includes a resonator stack that includes a first chiplet including a first acoustic resonator having a first resonant frequency and a second chiplet including a second acoustic resonator having a second resonant frequency that is different from the first resonant frequency; a substrate coupled to the resonator stack; and electrical interconnections between the first chiplet and the second chiplet to provide a conductive path between the first acoustic resonator and the second acoustic resonator.

Example 2 includes the device of Example 1, wherein the first acoustic resonator includes a first acoustic layer that has a first thickness, and wherein the second acoustic resonator includes a second acoustic layer that has a second thickness that is different from the first thickness.

Example 3 includes the device of Example 1 or Example 2, wherein the second thickness differs from the first thickness by at least a factor of two.

Example 4 includes the device of any of Examples 1 to 3, wherein the first chiplet and the second chiplet are formed from different wafers.

Example 5 includes the device of any of Examples 1 to 4, wherein the first chiplet and the second chiplet are included in a single stack layer of the resonator stack.

Example 6 includes the device of any of Examples 1 to 4, wherein the first chiplet in included in a first stack layer of the resonator stack, and wherein the second chiplet is included in a second stack layer of the resonator stack that is on the first stack layer.

Example 7 includes the device of any of Examples 1 to 6, wherein the first chiplet and the second chiplet are included in a filter circuit of the resonator stack.

Example 8 includes the device of Example 7, wherein the filter circuit includes a ladder-type bandpass filter.

Example 9 includes the device of Example 7 or Example 8, wherein the resonator stack further includes one or more additional chiplets that include one or more additional acoustic resonators having resonant frequencies different from the first resonant frequency and the second resonant frequency.

Example 10 includes the device of Example 9, wherein the filter circuit further includes the one or more additional acoustic resonators and is configured to operate as a broadband filter.

Example 11 includes the device of any of Examples 7 to 10, wherein the filter circuit is included in a duplexer.

Example 12 includes the device of any of Examples 7 to 10, wherein the filter circuit is coupled to a multiplexor that is further coupled to inductor-capacitor (LC)-resonator dies of a radiofrequency front-end filtering circuit.

Example 13 includes the device of Example 12 and further includes an antenna electrically connected to the filter circuit via one or more conductive contacts on the resonator stack.

Example 14 includes the device of any of Examples 1 to 13, wherein the resonator stack further includes: a first redistribution layer coupled to first components in a first stack layer; a second redistribution layer coupled to second components in a second stack layer; and a first set of through-mold vias electrically connecting the first redistribution layer to the second redistribution layer, and wherein the electrical interconnections are included in at least one of the first redistribution layer, the second redistribution layer, or the one or more through-mold vias.

Example 15 includes the device of any of Examples 1 to 14, wherein the resonator stack further includes an inductor chiplet that includes multiple inductors.

Example 16 includes the device of any of Examples 1 to 15, wherein the resonator stack further includes a capacitor chiplet that includes multiple capacitors.

According to Example 17, a method of fabrication includes placing a first chiplet with a first acoustic resonator having a first resonant frequency on a substrate; placing a second chiplet with a second acoustic resonator having a second resonant frequency on the substrate; and electrically connecting the first chiplet and the second chiplet to provide a conductive path between the first acoustic resonator and the second acoustic resonator.

Example 18 includes the method of Example 17, wherein the first chiplet is formed from a first wafer, and wherein the second chiplet is formed from a second wafer that is different from the first wafer.

Example 19 includes the method of Example 17 or Example 18, and further includes disposing a mold compound that at least partially encapsulates the first chiplet and the second chiplet in a first stack layer of a resonator stack; and forming a second stack layer of the resonator stack on the first stack layer, the second stack layer including a third acoustic resonator having a third resonant frequency and a fourth acoustic resonator having a fourth resonant frequency.

Example 20 includes the method of Example 19, wherein the resonator stack further includes a first redistribution layer coupled to first components in a first stack layer; a second redistribution layer coupled to second components in a second stack layer; and a first set of through-mold vias electrically connecting the first redistribution layer to the second redistribution layer, and wherein the conductive path is included in at least one of the first redistribution layer, the second redistribution layer, or the one or more through-mold vias.

Example 21 includes the method of Example 19 or Example 20 and further includes placing, in the resonator stack, an inductor chiplet that includes multiple inductors.

Example 22 includes the method of any of Examples 19 to 21 and further includes placing, in the resonator stack, a capacitor chiplet that includes multiple capacitors.

Example 23 includes the method of any of Examples 17 to 22, wherein the first acoustic resonator includes a first acoustic layer that has a first thickness, and wherein the second acoustic resonator includes a second acoustic layer that has a second thickness that is different from the first thickness.

Example 24 includes the method of Example 23, wherein the second thickness differs from the first thickness by at least a factor of two.

Example 25 includes the method of any of Examples 17 to 24, wherein the first chiplet and the second chiplet are included in a filter circuit of a resonator stack.

Example 26 includes the method of Example 25, wherein the filter circuit includes a ladder-type bandpass filter.

Example 27 includes the method of Example 25 or 26, wherein the resonator stack further includes one or more additional chiplets that include one or more additional acoustic resonators having resonant frequencies different from the first resonant frequency and the second resonant frequency.

Example 28 includes the method of Example 27, wherein the filter circuit further includes the one or more additional acoustic resonators and is configured to operate as a broadband filter.

According to Example 29, a device includes a resonator stack that includes a first stack layer including a first chiplet including a first acoustic resonator having a first resonant frequency; a second chiplet including a second acoustic resonator having a second resonant frequency that is different from the first resonant frequency. The resonator stack includes a second stack layer including a third chiplet including a third acoustic resonator having a third resonant frequency and a fourth chiplet including a fourth acoustic resonator having a fourth resonant frequency that is different from the third resonant frequency; and mold compound at least partially encapsulating the first chiplet, the second chiplet, the third chiplet, the fourth chiplet, and a set of through-mold conductors. The device also includes first electrical interconnections between the first chiplet and the second chiplet to provide a first conductive path between the first acoustic resonator and the second acoustic resonator; and second electrical interconnections between the third chiplet and the fourth chiplet to provide a second conductive path between the third acoustic resonator and the fourth acoustic resonator.

Example 30 includes the device of Example 29, wherein the first acoustic resonator includes a first acoustic layer that has a first thickness, and wherein the second acoustic resonator includes a second acoustic layer that has a second thickness that is different from first thickness.

Example 31 includes the device of Example 29 or Example 30, wherein the second thickness differs from the first thickness by at least a factor of two.

Example 32 includes the device of any of Examples 29 to 31, wherein the first chiplet is formed from a first wafer and the second chiplet is formed from a second wafer different than the first wafer.

Example 33 includes the device of any of Examples 29 to 32, wherein the resonator stack further includes: a first redistribution layer coupled to first components in the first stack layer, the first redistribution layer including the first electrical interconnections; and a second redistribution layer coupled to second components in the second stack layer, the second redistribution layer including the second electrical interconnections, and wherein the set of through-mold conductors electrically connect the first redistribution layer to the second redistribution layer.

Example 34 includes the device of any of Examples 29 to 33, wherein the resonator stack further includes an inductor chiplet that includes multiple inductors.

Example 35 includes the device of any of Examples 29 to 34, wherein the resonator stack further includes a capacitor chiplet that includes multiple capacitors.

Example 36 includes the device of any of Examples 29 to 35, wherein the resonator stack further includes one or more additional stack layers.

Example 37 includes the device of any of Examples 29 to 36, wherein the first chiplet, the second chiplet, the third chiplet, and the fourth chiplet are included in a filter circuit of the resonator stack.

Example 38 includes the device of Example 37, wherein the filter circuit includes a ladder-type bandpass filter.

Example 39 includes the device of Example 37 or Example 38, wherein the filter circuit is configured to operate as a broadband filter.

Example 40 includes the device of any of Examples 37 to 39, wherein the filter circuit is included in a duplexer.

Example 41 includes the device of any of Examples 37 to 39, wherein the filter circuit is coupled to a multiplexor that is further coupled to inductor-capacitor (LC)-resonator dies of a radiofrequency front-end filtering circuit.

Example 42 includes the device of any of Examples 37 to 41 and further includes an antenna electrically connected to the filter circuit via one or more conductive contacts on the resonator stack.

Example 43 includes the device of any of Examples 29 to 42, and further includes a substrate coupled to the resonator stack.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:
a resonator stack comprising:
a first chiplet including a first acoustic resonator having a first resonant frequency; and
a second chiplet including a second acoustic resonator having a second resonant frequency that is different from the first resonant frequency;
one or more additional chiplets that include one or more additional acoustic resonators having resonant frequencies different from the first resonant frequency and the second resonant frequency;
wherein the first chiplet and the second chiplet are included in a filter circuit of the resonator stack;
a substrate coupled to the resonator stack; and
electrical interconnections between the first chiplet and the second chiplet to provide a conductive path between the first acoustic resonator and the second acoustic resonator.

2. The device of claim 1, wherein the first acoustic resonator includes a first acoustic layer that has a first thickness, and wherein the second acoustic resonator includes a second acoustic layer that has a second thickness that is different from the first thickness.

3. The device of claim 2, wherein the second thickness differs from the first thickness by at least a factor of two.

4. The device of claim 1, wherein the first chiplet and the second chiplet are formed from different wafers.

5. The device of claim 1, wherein the first chiplet and the second chiplet are included in a single stack layer of the resonator stack.

6. The device of claim 1, wherein the first chiplet in included in a first stack layer of the resonator stack, and wherein the second chiplet is included in a second stack layer of the resonator stack that is on the first stack layer.

7. The device of claim 1, wherein the filter circuit includes a ladder-type bandpass filter.

8. The device of claim 1, wherein the filter circuit further includes the one or more additional acoustic resonators and is configured to operate as a broadband filter.

9. The device of claim 1, wherein the resonator stack further includes:
a first redistribution layer coupled to first components in a first stack layer;
a second redistribution layer coupled to second components in a second stack layer; and
a first set of through-mold vias electrically connecting the first redistribution layer to the second redistribution layer, and wherein the electrical interconnections are included in at least one of the first redistribution layer, the second redistribution layer, or the one or more through-mold vias.

10. The device of claim 1, wherein the resonator stack further includes an inductor chiplet that includes multiple inductors.

11. The device of claim 1, wherein the resonator stack further includes a capacitor chiplet that includes multiple capacitors.

12. A method of fabrication comprising:
placing a first chiplet with a first acoustic resonator having a first resonant frequency on a substrate;
placing a second chiplet with a second acoustic resonator having a second resonant frequency on the substrate, wherein the second resonant frequency is different from the first resonant frequency;
placing one or more additional chiplets that include one or more additional acoustic resonators having resonant frequencies different from the first resonant frequency and the second resonant frequency; and
electrically connecting the first chiplet and the second chiplet to provide a conductive path between the first acoustic resonator and the second acoustic resonator;
wherein the first chiplet and the second chiplet are included in a filter circuit of the resonator stack.

13. The method of claim 12, wherein the first chiplet is formed from a first wafer, and wherein the second chiplet is formed from a second wafer that is different from the first wafer.

14. The method of claim 13, further comprising:
disposing a mold compound that at least partially encapsulates the first chiplet and the second chiplet in a first stack layer of a resonator stack; and
forming a second stack layer of the resonator stack on the first stack layer, the second stack layer including a third acoustic resonator having a third resonant frequency and a fourth acoustic resonator having a fourth resonant frequency.

15. A device comprising:
a resonator stack comprising:
a first stack layer including:
a first chiplet including a first acoustic resonator having a first resonant frequency; and
a second chiplet including a second acoustic resonator having a second resonant frequency that is different from the first resonant frequency;
a second stack layer including:
a third chiplet including a third acoustic resonator having a third resonant frequency; and
a fourth chiplet including a fourth acoustic resonator having a fourth resonant frequency that is different from the third resonant frequency; and
mold compound at least partially encapsulating the first chiplet, the second chiplet, the third chiplet, the fourth chiplet, and a set of through-mold conductors;
first electrical interconnections between the first chiplet and the second chiplet to provide a first conductive path between the first acoustic resonator and the second acoustic resonator;
second electrical interconnections between the third chiplet and the fourth chiplet to provide a second conductive path between the third acoustic resonator and the fourth acoustic resonator;
wherein the first chiplet, the second chiplet, the third chiplet, and the fourth chiplet are included in a filter circuit of the resonator stack, the filter circuit is included in a duplexer.

16. The device of claim 15, wherein the first acoustic resonator includes a first acoustic layer that has a first thickness, and wherein the second acoustic resonator includes a second acoustic layer that has a second thickness that is different from first thickness.

17. The device of claim 16, wherein the second thickness differs from the first thickness by at least a factor of two.

18. The device of claim 15, wherein the first chiplet is formed from a first wafer and the second chiplet is formed from a second wafer different than the first wafer.

19. The device of claim 15, wherein the resonator stack further includes:

a first redistribution layer coupled to first components in the first stack layer, the first redistribution layer including the first electrical interconnections; and a second redistribution layer coupled to second components in the second stack layer, the second redistribution layer including the second electrical interconnections, and wherein the set of through-mold conductors electrically connect the first redistribution layer to the second redistribution layer.

20. The device of claim 15, wherein the resonator stack further includes an inductor chiplet that includes multiple inductors.

21. The device of claim 15, wherein the resonator stack further includes a capacitor chiplet that includes multiple capacitors.

22. The device of claim 15, wherein the resonator stack further includes one or more additional stack layers.

23. The device of claim 15, wherein the filter circuit includes a ladder-type bandpass filter.

24. The device of claim 15, wherein the filter circuit is configured to operate as a broadband filter.

25. The device of claim 15, wherein the filter circuit is coupled to a multiplexor that is further coupled to inductor-capacitor (LC)-resonator dies of a radiofrequency front-end filtering circuit.

26. The device of claim 15, further comprising an antenna electrically connected to the filter circuit via one or more conductive contacts on the resonator stack.

* * * * *